US011227721B2

(12) United States Patent
Tozawa et al.

(10) Patent No.: US 11,227,721 B2
(45) Date of Patent: Jan. 18, 2022

(54) ELECTRONIC COMPONENT

(71) Applicant: TDK CORPORATION, Tokyo (JP)

(72) Inventors: Yoji Tozawa, Minato-ku (JP); Masashi Shimoyasu, Minato-ku (JP); Makoto Yoshino, Minato-ku (JP); Takuo Abe, Minato-ku (JP); Akihiko Oide, Minato-ku (JP); Tsutomu Ono, Minato-ku (JP); Shinichi Sato, Minato-ku (JP); Makoto Morita, Minato-ku (JP); Shinichi Sato, Minato-ku (JP); Hidekazu Sato, Minato-ku (JP); Masashi Kitazaki, Minato-ku (JP); Naoki Uchida, Minato-ku (JP); Masahiro Kato, Yuri-Honjo (JP)

(73) Assignee: TDK CORPORATION, Tokyo (JP)

( * ) Notice: Subject to any disclaimer, the term of this patent is extended or adjusted under 35 U.S.C. 154(b) by 575 days.

(21) Appl. No.: 15/821,998

(22) Filed: Nov. 24, 2017

(65) Prior Publication Data

US 2018/0337001 A1 Nov. 22, 2018

(30) Foreign Application Priority Data

Nov. 24, 2016 (JP) .............................. JP2016-227877
May 19, 2017 (JP) .............................. JP2017-100068

(51) Int. Cl.
*H01F 27/29* (2006.01)
*H01G 4/232* (2006.01)
(Continued)

(52) U.S. Cl.
CPC ............. *H01G 4/2325* (2013.01); *H01B 1/22* (2013.01); *H01F 17/0013* (2013.01);
(Continued)

(58) Field of Classification Search
CPC ...... H01G 4/2325; H01G 4/232; H01G 4/252; H01G 13/006; H01G 4/30; H01G 4/12;
(Continued)

(56) References Cited

U.S. PATENT DOCUMENTS 5,655,287 A * 8/1997 Ushiro ................ H01F 27/2804
29/412
9,378,884 B2 * 6/2016 Kim .................... H01F 17/0013
(Continued)

FOREIGN PATENT DOCUMENTS

JP H06-061088 A 3/1994
JP H8-138903 A 5/1996
(Continued)

*Primary Examiner* — Tuyen T Nguyen
(74) *Attorney, Agent, or Firm* — Oliff PLC

(57) ABSTRACT

An electronic component includes an element body, an external electrode, and a resin film having electrical insulation properties. The element body includes a principal surface and a side surface adjacent to the principal surface. The external electrode includes a first electrode portion disposed on the principal surface and a second electrode portion disposed on the side surface. The resin film is disposed on the principal surface and is in contact with the principal surface. Each of the first electrode portion and the second electrode portion includes a conductive resin layer disposed on the element body. A conductive resin layer included in the first electrode portion is disposed on the resin film and is in contact with the resin film.

7 Claims, 24 Drawing Sheets

(51) Int. Cl.
*H01G 4/252* (2006.01)
*H01G 13/00* (2013.01)
*H05K 1/03* (2006.01)
*H01B 1/22* (2006.01)
*H01G 4/30* (2006.01)
*H03H 7/42* (2006.01)
*H01F 17/00* (2006.01)
*H01F 27/32* (2006.01)
*H01G 4/12* (2006.01)
*H03H 1/00* (2006.01)
*H05K 3/34* (2006.01)

(52) U.S. Cl.
CPC .......... *H01F 27/29* (2013.01); *H01F 27/292* (2013.01); *H01F 27/32* (2013.01); *H01F 27/324* (2013.01); *H01G 4/232* (2013.01); *H01G 4/252* (2013.01); *H01G 4/30* (2013.01); *H01G 13/006* (2013.01); *H03H 7/427* (2013.01); *H05K 1/0306* (2013.01); *H01F 2017/0066* (2013.01); *H01F 2017/0093* (2013.01); *H01G 4/12* (2013.01); *H03H 2001/0057* (2013.01); *H03H 2001/0085* (2013.01); *H05K 3/3442* (2013.01); *H05K 2201/1006* (2013.01); *H05K 2201/10636* (2013.01)

(58) Field of Classification Search
CPC ........ H01F 27/29; H01F 27/32; H01F 27/292; H01F 27/324; H01F 17/0013; H01F 2017/0066; H01F 2017/0093; H01F 17/04; H01F 2017/048; H05K 1/0306; H05K 2201/1006; H05K 3/3442; H05K 2201/10636; H01B 1/22; H03H 7/427; H03H 2001/0057; H03H 2001/0085; Y02P 70/50
See application file for complete search history.

(56) References Cited

U.S. PATENT DOCUMENTS

| | | |
|---|---|---|
| 2003/0214793 A1 | 11/2003 | Uchida et al. |
| 2009/0103237 A1* | 4/2009 | Nagamiya .............. H01G 4/012 |
| | | 361/321.2 |
| 2011/0267167 A1 | 11/2011 | Ogawa et al. |
| 2012/0119871 A1 | 5/2012 | Ogawa et al. |
| 2013/0200970 A1 | 8/2013 | Ogawa et al. |
| 2014/0145816 A1 | 5/2014 | Sato et al. |
| 2014/0176280 A1 | 6/2014 | Lee et al. |
| 2014/0204502 A1 | 7/2014 | Chun et al. |
| 2016/0042857 A1* | 2/2016 | Chun ................... H01F 27/292 |
| | | 336/200 |
| 2016/0086714 A1 | 3/2016 | Moon et al. |

FOREIGN PATENT DOCUMENTS

| | | | | |
|---|---|---|---|---|
| JP | H08-162357 A | 6/1996 | | |
| JP | H10-092606 A | 4/1998 | | |
| JP | H11-297507 A | 10/1999 | | |
| JP | 2003-022913 A | 1/2003 | | |
| JP | 2004-297020 A | 10/2004 | | |
| JP | 2011-249774 A | 12/2011 | | |
| JP | 2012-033616 A | 2/2012 | | |
| JP | 2014-143387 A | 8/2014 | | |
| JP | 2014143387 A | * | 8/2014 | ............. H01G 4/232 |
| JP | 2014-170875 A | 9/2014 | | |
| JP | 2015-076571 A | 4/2015 | | |
| KR | 10-2013-0126723 A | 11/2013 | | |
| KR | 10-2014-0083579 A | 7/2014 | | |
| KR | 101580411 B1 | 12/2015 | | |
| WO | 2016/017511 A1 | 2/2016 | | |

* cited by examiner

ELECTRONIC COMPONENT

BACKGROUND OF THE INVENTION

1. Field of the Invention

The present invention relates to an electronic component.

2. Description of Related Art

Known electronic components include an element body and an external electrode disposed on the element body (for example, see Japanese Unexamined Patent Publication No. 2014-143387). In this electronic component, the external electrode includes a sintered metal layer disposed on a surface of the element body and a conductive resin layer disposed to cover the sintered metal layer.

SUMMARY OF THE INVENTION

An object of one and another aspects of the present invention is to provide an electronic component that suppresses peeling of the conductive resin layer.

As a result of investigation and research, the inventors of the present invention have discovered the following facts.

The conductive resin layer is in contact with the element body. In the electronic component described in Japanese Unexamined Patent Publication No. 2014-143387, the conductive resin layer is disposed to cover the sintered metal layer, and thus an edge of the conductive resin layer is in contact with the element body. The conductive resin layer typically includes a conductive material (for example, metal powder) and a resin (for example, a thermosetting resin) and thus has lower adhesive strength with an element body than a resin including no conductive material.

When the electronic component is mounted on an electronic device, an external force acting on the electronic component from the electronic device may act as a stress on the external electrode. For example, when the electronic device is a substrate, the external force acts on the electronic component as the substrate is bent. Since the stress acting on the external electrode tends to act on a portion of the external electrode, in particular, the portion being disposed on a principal surface that is arranged to constitute a mounting surface, the conductive resin layer included in the external electrode may be peeled off from the element body.

If the conductive resin layer is peeled off from the element body, mounting strength of the electronic component may be decreased. In addition, moisture may infiltrate into the electronic component from between the element body and the conductive resin layer, and electrical characteristics of the electronic component may be deteriorated.

An electronic component according to one aspect of the present invention includes an element body, an external electrode, and a resin film having electrical insulation properties. The element body has a principal surface and a side surface. The principal surface is arranged to constitute a mounting surface. The principal surface and the side surface are adjacent to each other. The external electrode includes a first electrode portion disposed on the principal surface and a second electrode portion disposed on the side surface. The resin film is disposed on the principal surface and is in contact with the principal surface. Each of the first electrode portion and the second electrode portion includes a conductive resin layer disposed on the element body. A conductive resin layer included in the first electrode portion is disposed on the resin film and is in contact with the resin film.

In the one aspect, the conductive resin layer included in the first electrode portion is in contact with the resin film in contact with the principal surface of the element body. The resin film is interposed between the conductive resin layer included in the first electrode portion and the principal surface of the element body. Unlike the conductive resin layer, the resin film does not contain a conductive material and has high adhesive strength with the element body. Like the resin film, the conductive resin layer contains a resin, and thus has high adhesive strength with the resin film. Therefore, in the one aspect, the conductive resin layer included in the first electrode portion tends not to peel off.

The electronic component according to the one aspect may include an internal conductor. The internal conductor is disposed in the element body and includes an end exposed at the side surface. The second electrode portion may include a sintered metal layer connected with an end of the internal conductor. The sintered metal layer may be disposed on the side surface and may be in contact with the side surface. The conductive resin layer included in the second electrode portion may be disposed on the element body in such a manner that the sintered metal layer is disposed between the element body and the conductive resin layer included in the second electrode portion. In which case, the internal conductor is electrically connected with the conductive resin layer through the sintered metal layer. Therefore, in this embodiment, connection strength between the internal conductor and the external electrode is high and the internal conductor and the external electrode are reliably electrically connected, as compared with in an electronic component in which an internal conductor and a conductive resin layer are directly connected.

In the one aspect, the resin film may cover an edge of the sintered metal layer and may be in contact with the edge. In which case, the end of the resin film is sandwiched between the sintered metal layer and the conductive resin layer. Therefore, the resin film tends not to peel off.

In the one aspect, the element body may include a side surface opposing the side surface. The external electrode may include a plurality of terminal electrodes disposed on each of both end portions of the element body in a direction in which the pair of side surfaces opposes each other. When the plurality of terminal electrodes are disposed at each of both end portions of the element body in the direction in which the pair of side surfaces opposes each other, each of the terminal electrode is not formed to cover the entire side surface. The area of each of the terminal electrodes must be small. Therefore, the area of the conductive resin layer is small, and the adhesive strength of the conductive resin layer may be decreased. However, the conductive resin layer included in the first electrode portion is in contact with the resin film in contact with the principal surface of the element body. Therefore, the conductive resin layer included in the first electrode portion tends not to peel off.

In the one aspect, the resin film may be in contact with the conductive resin layers included in the first electrode portions of at least two adjacent terminal electrodes. In which case, formation of the resin film is easy.

In the one aspect, the resin film may be provided for each terminal electrode and may be in contact with the conductive resin layer included in the first electrode portion of the corresponding terminal electrode. In which case, the amount of resin used for forming the resin film is reduced.

As a result of investigation and research, the inventors of the present invention have further discovered the following facts.

When a resin (for example, a thermosetting resin) is provided on a surface of an element body made of a dielectric layer, adhesive strength of the resin to the surface of the element body is improved by the anchor effect as the surface of the element body becomes rougher. By making the surface of the element body rough, adhesive strength between a conductive resin layer included in an external electrode and the surface of the element body is improved.

However, when the element body includes a magnetic portion made of a ferrite material and the conductive resin layer is provided on the surface of the magnetic portion, the conductive resin layer tends to peel off from the element body even though the surface of the magnetic portion is rough. This may be caused because the anchor effect tends not to be exhibited between the magnetic portion and the conductive resin layer.

If the conductive resin layer peel off from the element body (magnetic portion), the external electrode including the conductive resin layer may also peel off from the element body, and moisture may infiltrate into the element body from between the element body and the conductive resin layer. If the moisture infiltrates into the element body, electrical characteristics of the electronic component may be deteriorated.

The inventors of the present invention have conducted intensive studies on a configuration in which the external electrode tends not to peel off from the element body even when the conductive resin layer is disposed on the magnetic portion made of a ferrite material. As a result, the present inventors have found the following configuration. An amorphous glass layer is formed on the surface of the magnetic portion and the amorphous glass layer is disposed between an edge of the conductive resin layer included in the external electrode and the surface of the magnetic portion. In this configuration, although a surface of the amorphous glass layer is smoother than the surface of the magnetic portion, peeling of the conductive resin layer from the element body is suppressed, as compared with a multilayer common mode filter having the conductive resin layer directly disposed on the magnetic portion.

An electronic component according to another aspect of the present invention includes an element body, an amorphous glass layer, and an external electrode. The element body includes a magnetic portion made of a ferrite material. The amorphous glass layer is formed on a surface of the magnetic portion. The external electrode includes a conductive resin layer disposed on the element body. The amorphous glass layer is disposed between an edge of the conductive resin layer and the surface of the magnetic portion.

In the another aspect, the amorphous glass layer is disposed between the edge of the conductive resin layer and the surface of the magnetic portion. Therefore, peeling of the conductive resin layer from the element body is suppressed.

In the another aspect, the element body may include a principal surface including at least a part of the surface of the magnetic portion and a side surface adjacent to the principal surface. The external electrode may include a first electrode portion disposed on the principal surface and a second electrode portion disposed on the side surface. The amorphous glass layer may be formed on the principal surface. The conductive resin layer may be included in the first electrode portion and the second electrode portion. The edge of the conductive resin layer may be included in the first electrode portion. The amorphous glass layer may be disposed between the edge of the conductive resin layer and the principal surface. When the electronic component according to this embodiment is mounted on an electronic device in a state where the principal surface opposes the electronic device, an external force acting on the electronic component from the electronic device tends to act as a stress on the first electrode portion. If the external force acts on the first electrode portion, the conductive resin layer included in the first electrode portion may peel off from the element body (amorphous glass layer). However, in this embodiment, the amorphous glass layer is disposed between the edge of the conductive resin layer and the principal surface. Therefore, even when the electronic component is mounted on the electronic device, the conductive resin layer tends not to peel off from the element body (amorphous glass layer).

The electronic component according to the another aspect may include an insulating resin layer. The insulating resin layer may be disposed between the amorphous glass layer and the edge of the conductive resin layer. The edge of the conductive resin layer may be in contact with the insulating resin layer. The conductive resin layer typically contains a conductive material (for example, a metal powder) and a resin (for example, a thermosetting resin). The insulating resin layer not containing a conductive material has higher adhesive strength to the amorphous glass coat layer than the conductive resin layer. Therefore, when the edge of the conductive resin layer is in contact with the insulating resin layer, peeling of the conductive resin layer from the element body (amorphous glass layer) is further suppressed.

In the another aspect, the external electrode may include a plurality of terminal electrodes. Each of the terminal electrodes includes the conductive resin layer. When the plurality of terminal electrodes is disposed on the element body, the contact area between the conductive resin layer of each of the terminal electrodes and the element body is small, as compared with when the number of terminal electrodes is one. When the contact area between the conductive resin layer and the element body is small, the conductive resin layer may peel off from the element body. However, the amorphous glass layer is disposed between the edge of the conductive resin layer and the surface of the magnetic portion, and thus the conductive resin layer tends not to peel off from the element body (amorphous glass layer).

In the another aspect, the external electrode may include a sintered metal layer made of Ag. The conductive resin layer may be disposed on the sintered metal layer and may be in contact with the sintered metal layer.

In the another aspect, surface roughness of the amorphous glass layer may be smaller than surface roughness of the magnetic portion.

The present invention will become more fully understood from the detailed description given hereinafter and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF EMBODIMENTS

Figure 1:
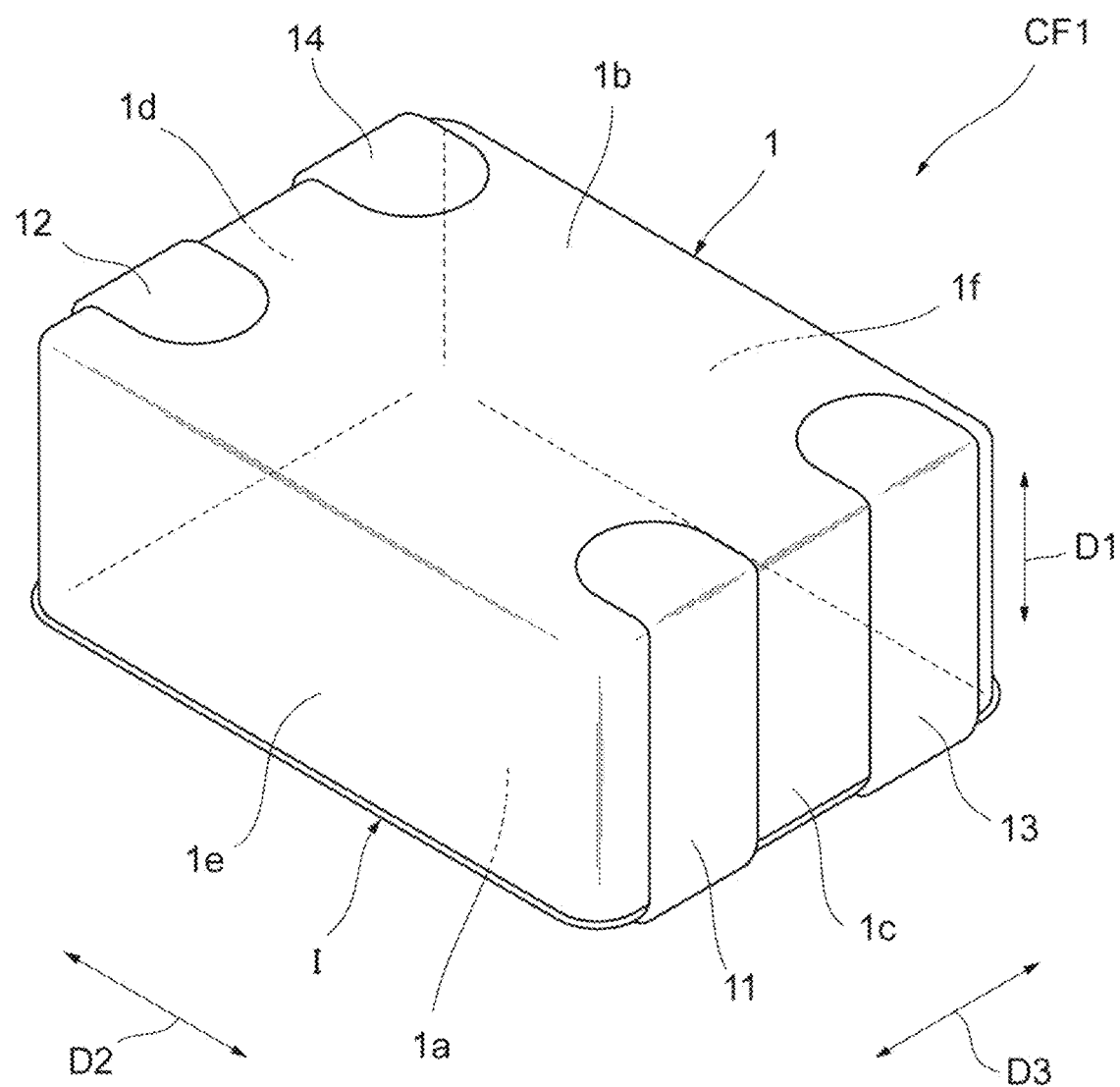
FIG. 1 is a perspective view illustrating a multilayer common mode filter according to a first embodiment.

Hereinafter, embodiments of the present invention will be described in detail with reference to the accompanying drawings. In the following description, the same elements or elements having the same functions are denoted with the same reference numerals and overlapped explanation is omitted.

First Embodiment

Figure 2:
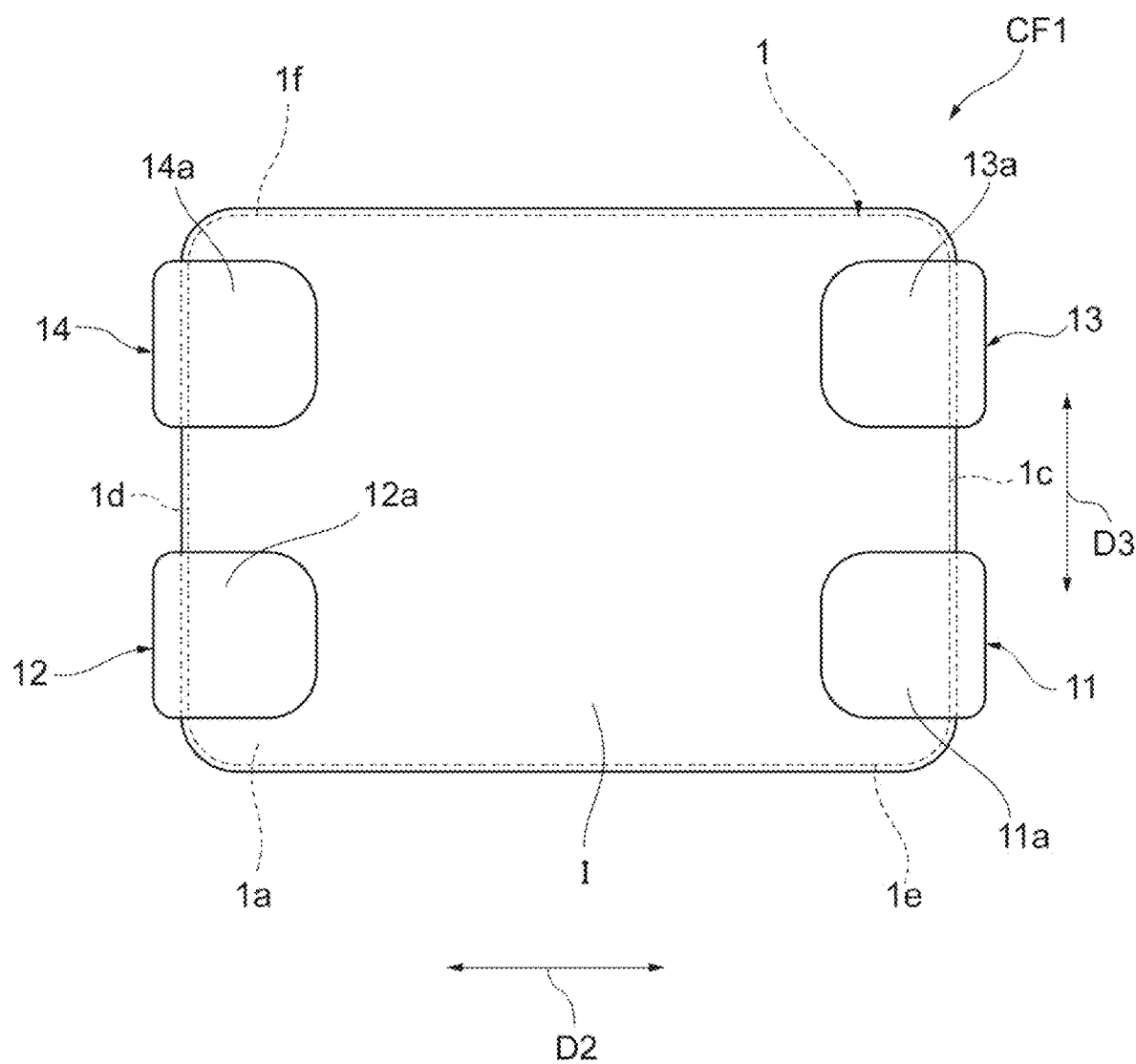
FIG. 2 is a plan view illustrating the multilayer common mode filter according to the first embodiment.
Figure 3:
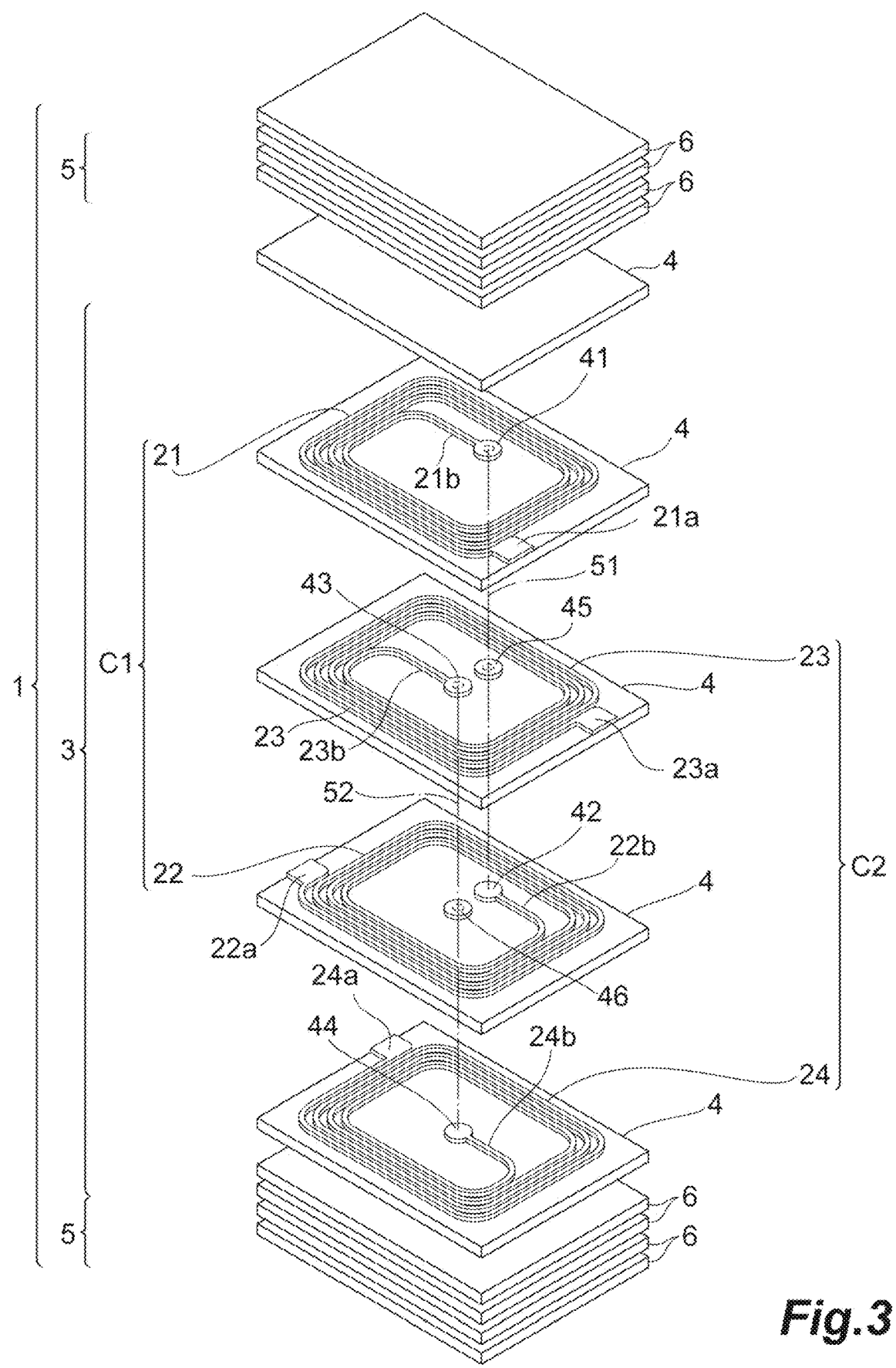
FIG. 3 is an exploded perspective view illustrating a configuration of an element body.
Figure 4:
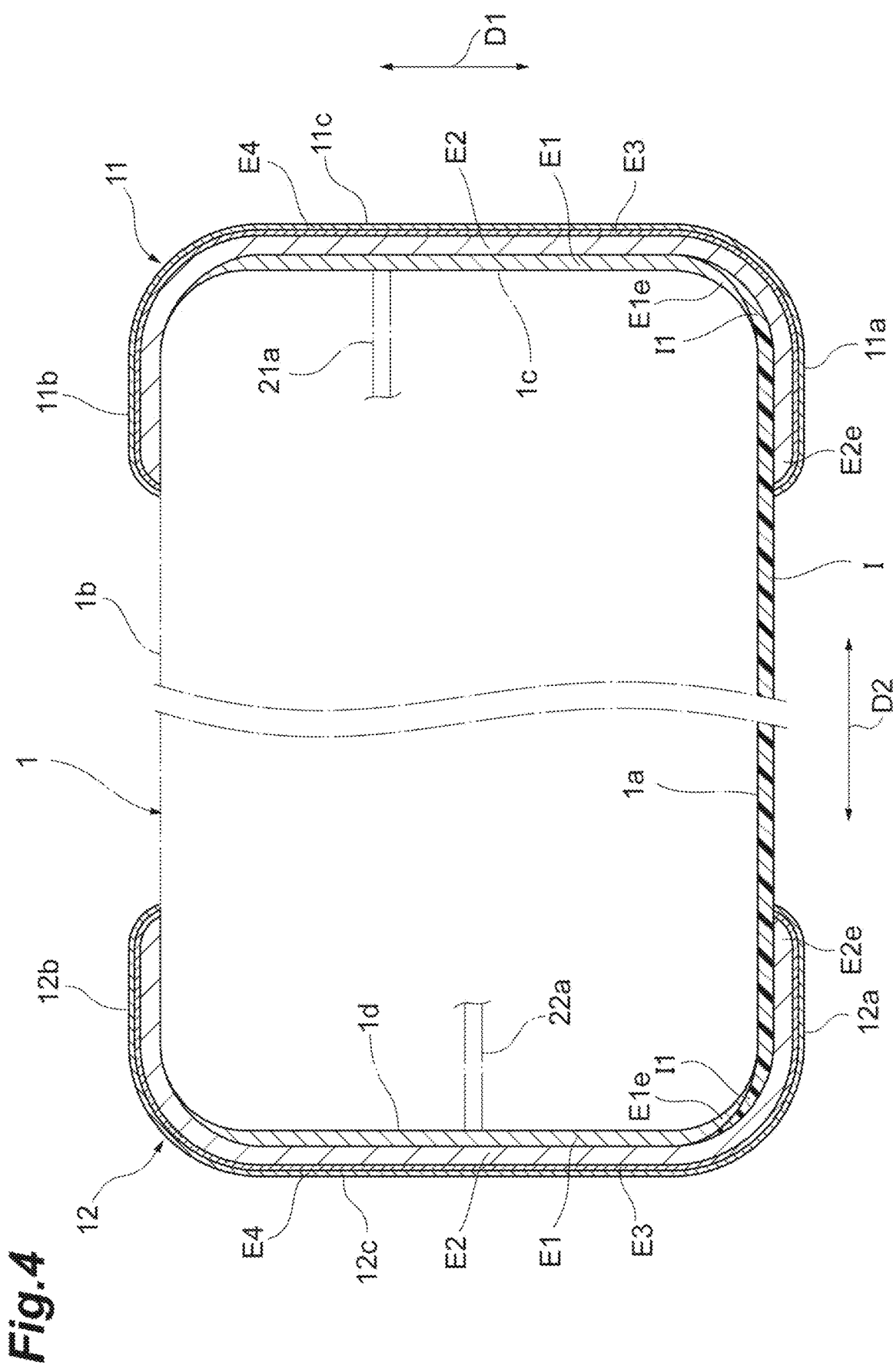
FIG. 4 is a diagram illustrating a cross-sectional configuration of a first terminal electrode, a second terminal electrode, and a resin film.
Figure 5:
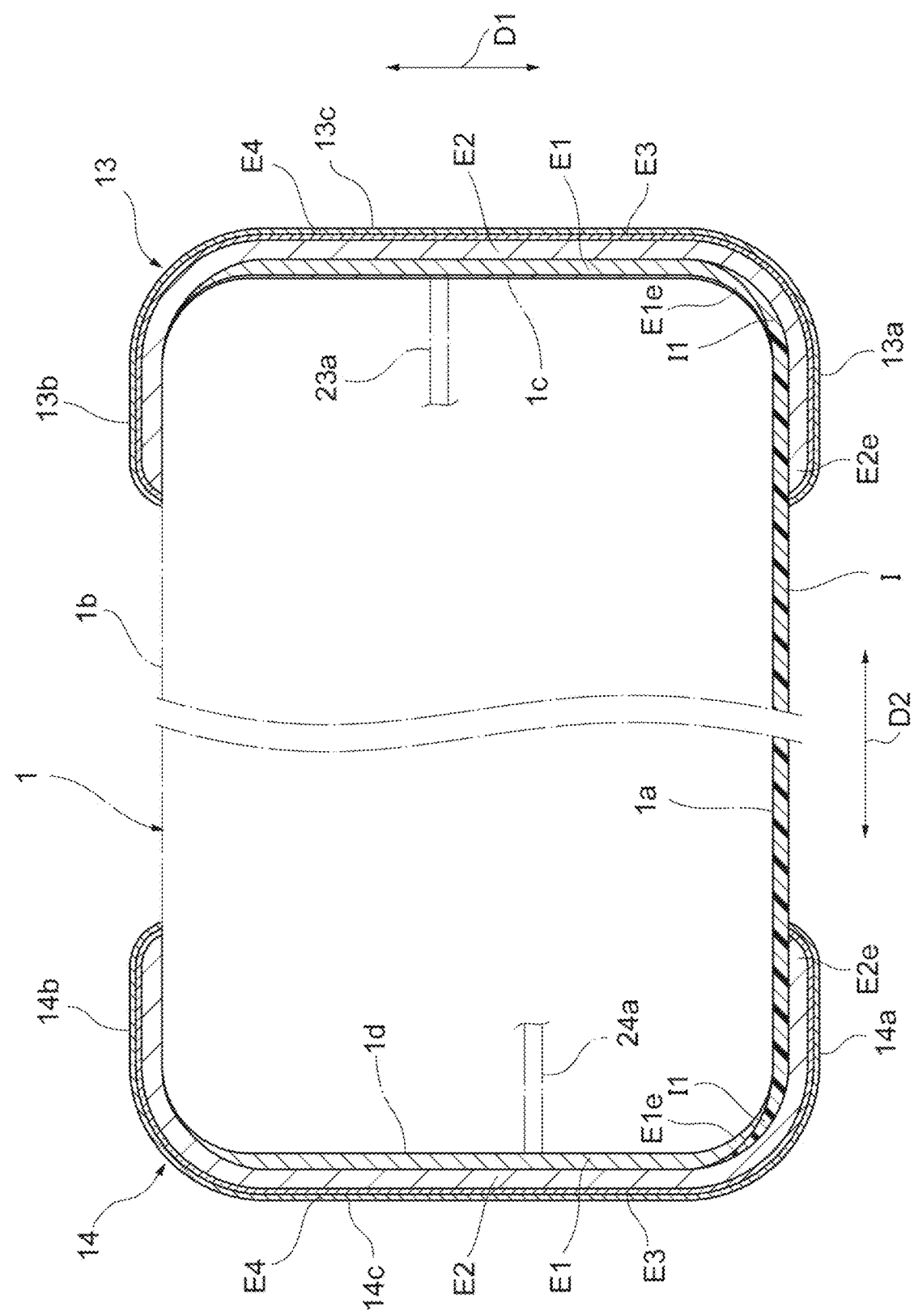
FIG. 5 is a diagram illustrating a cross-sectional configuration of a third terminal electrode, a fourth terminal electrode, and a resin film.

A configuration of a multilayer common mode filter CF1 according to a first embodiment will be described with reference to FIGS. 1 to 5. FIG. 1 is a perspective view illustrating a multilayer common mode filter according to a first embodiment. FIG. 2 is a plan view illustrating the multilayer common mode filter according to the first embodiment. FIG. 3 is an exploded perspective view illustrating a configuration of an element body. FIG. 4 is a diagram illustrating a cross-sectional configuration of a first terminal electrode, a second terminal electrode, and a resin film. FIG. 5 is a diagram illustrating a cross-sectional configuration of a third terminal electrode, a fourth terminal electrode, and a resin film. In the present embodiment, an electronic component is the multilayer common mode filter CF1, for example.

As illustrated in FIGS. 1 to 3, the multilayer common mode filter CF1 includes an element body 1 and an external electrode. The external electrode includes a first terminal electrode 11, a second terminal electrode 12, a third terminal electrode 13, and a fourth terminal electrode 14. The first terminal electrode 11, the second terminal electrode 12, the third terminal electrode 13, and the fourth terminal electrode 14 are disposed on an external surface of the element body 1. The multilayer common mode filter CF1 is mounted on an electronic device (for example, a circuit board or an electronic component) by soldering in such a manner that the first terminal electrode 11, the second terminal electrode 12, the third terminal electrode 13, and the fourth terminal electrode 14 are separately connected to signal lines.

The element body 1 has a rectangular parallelepiped shape. The element body 1 includes a first principal surface 1a and a second principal surface 1b opposing each other, a first side surface 1c and a second side surface 1d opposing each other, and a third side surface 1e and a fourth side surface if opposing each other. A direction in which the first principal surface 1a and the second principal surface 1b oppose each other is a first direction D1. A direction in which the first side surface 1c and the second side surface 1d oppose each other is a second direction D2. A direction in which the third side surface 1e and the fourth side surface 1f oppose each other is a third direction D3. In the present embodiment, the first direction D1 is a height direction of the element body 1. The second direction D2 is a longitudinal direction of the element body 1. The third direction D3 is a width direction of the element body 1. The rectangular parallelepiped shape includes a shape of a rectangular parallelepiped in which a corner portion and a ridge portion are chamfered and a shape of a rectangular parallelepiped in which a corner portion and a ridge portion are rounded.

The first side surface 1c and the second side surface 1d extend in the first direction D1 to connect the first principal surface 1a and the second principal surface 1b. The first side surface 1c and the second side surface 1d are adjacent to the first principal surface 1a and are also adjacent to the second principal surface 1b. The first side surface 1c and the second side surface 1d also extend in the third direction D3. The third direction D3 is also a short side direction of the first principal surface 1a and the second principal surface 1b.

The third side surface 1e and the fourth side surface if extend in the first direction D1 to connect the first principal surface 1a and the second principal surface 1b. The first side surface 1c and the second side surface 1d are adjacent to the first principal surface 1a and are also adjacent to the second principal surface 1b. The third side surface 1e and the fourth side surface 1f also extend in the second direction D2. The second direction D2 is also a long side direction of the first principal surface 1a and the second principal surface 1b.

The element body 1 includes a non-magnetic portion 3 and a pair of magnetic portions 5. The pair of magnetic portions 5 is disposed to sandwich the non-magnetic portion 3 in the first direction D1. The element body 1 includes a plurality of laminated insulating layers. In the non-magnetic portion 3, a plurality of non-magnetic layers 4 are laminated. The non-magnetic portion 3 includes the plurality of laminated non-magnetic layers 4. In each of the magnetic portions 5, a plurality of magnetic layers 6 are laminated. Each of the magnetic portions 5 includes the plurality of laminated magnetic layers 6. The plurality of insulating layers include the plurality of non-magnetic layers 4 and the plurality of magnetic layers 6.

Each of the non-magnetic layers 4 is configured by a sintered body of a ceramic green sheet including a non-magnetic material, for example. The non-magnetic material is a Cu—Zn based ferrite material, a dielectric material, or a glass ceramic material, for example. Each of the magnetic layers 6 is configured by a sintered body of a ceramic green sheet including a magnetic material, for example. The magnetic material is a Ni—Cu—Zn based ferrite material, a Ni—Cu—Zn—Mg based ferrite material, or a Ni—Cu based ferrite material, for example.

In the actual element body 1, the non-magnetic layers 4 and the magnetic layers 6 are integrated in such a manner that inter-layer boundaries cannot be visualized. The first direction D1 (the direction in which the first principal surface 1a and the second principal surface 1b oppose each other) is matched with a direction in which the plurality of insulating layers (the plurality of non-magnetic layers 4 and the plurality of magnetic layers 6) are laminated. Hereinafter, the direction in which the plurality of insulating layers are laminated is simply referred to as a "lamination direction".

As illustrated in FIG. 3, the multilayer common mode filter CF1 includes a first coil conductor 21, a second coil conductor 22, a third coil conductor 23, and a fourth coil conductor 24 in the non-magnetic portion 3. The first coil conductor 21, the second coil conductor 22, the third coil conductor 23, and the fourth coil conductor 24 are internal conductors disposed in the element body 1. The first to fourth coil conductors 21 to 24 include a conductive material (for example, Ag or Pd). The first to fourth coil conductors 21 to 24 are configured as sintered bodies of conductive paste including a conductive material (for example, Ag powder or Pd powder).

The first coil conductor 21 has a spiral shape and is disposed between a pair of the non-magnetic layers 4 adjacent to each other in the lamination direction. One end (outside end) 21a of the first coil conductor 21 is exposed at the first side surface 1c. Another end (inside end) 21b of the first coil conductor 21 is connected to a first pad conductor 41. The first pad conductor 41 is located at the same layer as the first coil conductor 21. In the present embodiment, the first coil conductor 21 and the first pad conductor 41 are integrally formed.

The second coil conductor 22 has a spiral shape and is disposed between a pair of the non-magnetic layers 4 adjacent to each other in the lamination direction. One end (outside end) 22a of the second coil conductor 22 is exposed at the second side surface 1d. Another end (inside end) 22b of the second coil conductor 22 is connected to a second pad conductor 42. The second pad conductor 42 is located at the same layer as the second coil conductor 22. In the present embodiment, the second coil conductor 22 and the second pad conductor 42 are integrally formed.

The third coil conductor 23 has a spiral shape and is disposed between a pair of the non-magnetic layers 4 adjacent to each other in the lamination direction. One end (outside end) 23a of the third coil conductor 23 is exposed at the first side surface 1c. Another end (inside end) 23b of the third coil conductor 23 is connected to a third pad conductor 43. The third pad conductor 43 is located at the same layer as the third coil conductor 23. In the present embodiment, the third coil conductor 23 and the third pad conductor 43 are integrally formed.

The fourth coil conductor 24 has a spiral shape and is disposed between a pair of the non-magnetic layers 4 adjacent to each other in the lamination direction. One end (outside end) 24a of the fourth coil conductor 24 is exposed at the second side surface 1d. Another end (inside end) 24b of the fourth coil conductor 24 is connected to a fourth pad conductor 44. The fourth pad conductor 44 is located at the same layer as the fourth coil conductor 24. In the present embodiment, the fourth coil conductor 24 and the fourth pad conductor 44 are integrally formed.

The first coil conductor 21 and the third coil conductor 23 are adjacent to each other in the lamination direction in a state where the non-magnetic layer 4 is interposed between the first coil conductor 21 and the third coil conductor 23. The non-magnetic layer 4 is sandwiched between the first coil conductor 21 and the third coil conductor 23. The second coil conductor 22 and the fourth coil conductor 24 are adjacent to each other in the lamination direction in a state where the non-magnetic layer 4 is interposed between the second coil conductor 22 and the fourth coil conductor 24. The non-magnetic layer 4 is sandwiched between the second coil conductor 22 and the fourth coil conductor 24. The third coil conductor 23 is positioned between the first coil conductor 21 and the second coil conductor 22 in the lamination direction. The first to fourth coil conductors 21 to 24 are disposed in the order of the first coil conductor 21, the third coil conductor 23, the second coil conductor 22, and the fourth coil conductor 24 in the lamination direction. The first to fourth coil conductors 21 to 24 are wound in the same direction and are positioned to overlap each other, when viewed from the lamination direction.

The first pad conductor 41 and the second pad conductor 42 are positioned to overlap each other when viewed from the lamination direction. A fifth pad conductor 45 is disposed between the first pad conductor 41 and the second pad conductor 42 to overlap the first and second pad conductors 41 and 42 when viewed from the lamination direction. The fifth pad conductor 45 is located at the same layer as the third coil conductor 23. The first pad conductor 41 and the fifth pad conductor 45 are adjacent to each other in the lamination direction in a state where the non-magnetic layer 4 is interposed between the first pad conductor 41 and the fifth pad conductor 45. The non-magnetic layer 4 is sandwiched between the first pad conductor 41 and the fifth pad conductor 45. The fifth pad conductor 45 and the second pad conductor 42 are adjacent to each other in the lamination direction in a state where the non-magnetic layer 4 is interposed between the fifth pad conductor 45 and the second pad conductor 42. The non-magnetic layer 4 is sandwiched between the fifth pad conductor 45 and the second pad conductor 42.

The first pad conductor 41, the fifth pad conductor 45, and the second pad conductor 42 are connected through a first through-hole conductor 51. The first through-hole conductor 51 penetrates the non-magnetic layer 4 positioned between the first pad conductor 41 and the fifth pad conductor 45, and the non-magnetic layer 4 positioned between the fifth pad conductor 45 and the second pad conductor 42.

The third pad conductor 43 and the fourth pad conductor 44 are positioned to overlap each other when viewed from the lamination direction. A sixth pad conductor 46 is disposed between the third pad conductor 43 and the fourth pad conductor 44 to overlap the third and fourth pad conductors 43 and 44 when viewed from the lamination direction. The sixth pad conductor 46 is located at the same layer as the second coil conductor 22. The third pad conductor 43 and the sixth pad conductor 46 are adjacent to each other in the lamination direction in a state where the non-magnetic layer 4 is interposed between the third pad conductor 43 and the sixth pad conductor 46. The non-magnetic layer 4 is sandwiched between the third pad conductor 43 and the sixth pad conductor 46. The sixth pad conductor 46 and the fourth pad conductor 44 are adjacent to each other in the lamination direction in a state where the non-magnetic layer 4 is interposed between the sixth pad conductor 46 and the fourth pad conductor 44. The non-magnetic layer 4 is sandwiched between the sixth pad conductor 46 and the fourth pad conductor 44.

The third pad conductor 43, the sixth pad conductor 46, and the fourth pad conductor 44 are connected through a second through-hole conductor 52. The second through-hole conductor 52 penetrates the non-magnetic layer 4 positioned between the third pad conductor 43 and the sixth pad conductor 46, and the non-magnetic layer 4 positioned between the sixth pad conductor 46 and the fourth pad conductor 44.

The first coil conductor 21 and the second coil conductor 22 are electrically connected through the first pad conductor 41, the fifth pad conductor 45, the second pad conductor 42, and the first through-hole conductor 51. The first coil conductor 21 and the second coil conductor 22 configure a first coil C1. The third coil conductor 23 and the fourth coil conductor 24 are electrically connected through the third pad conductor 43, the sixth pad conductor 46, the fourth pad conductor 44, and the second through-hole conductor 52. The third coil conductor 23 and the fourth coil conductor 24 configure a second coil C2.

The multilayer common mode filter CF1 includes the first coil C1 and the second coil C2 in the element body 1 (non-magnetic portion 3). The first coil C1 and the second coil C2 are disposed in the non-magnetic portion 3 in such a manner that the first coil conductor 21 and the third coil conductor 23 are adjacent to each other in the lamination direction, the third coil conductor 23 and the second coil conductor 22 are adjacent to each other in the lamination direction, and the second coil conductor 22 and the fourth coil conductor 24 are adjacent to each other in the lamination direction. The first coil C1 and the second coil C2 are arranged to be magnetically coupled to each other.

The fifth and sixth pad conductors 45 and 46 and the first and second through-hole conductors 51 and 52 include a conductive material (for example, Ag or Pd). The fifth and sixth pad conductors 45 and 46 and the first and second through-hole conductors 51 and 52 are configured as a sintered body of conductive paste containing a conductive material (for example, Ag powder or Pd powder). The first and second through-hole conductors 51 and 52 are formed by sintering conductive paste filled in through-holes formed in ceramic green sheets that configure the corresponding non-magnetic layers 4.

The first terminal electrode 11 and the third terminal electrode 13 are disposed on the first side surface 1c side of the element body 1. The first terminal electrode 11 and the third terminal electrode 13 are disposed on one end portion of the element body 1 in the second direction D2. The first terminal electrode 11 and the third terminal electrode 13 are disposed on the first side surface 1c to cover a part of the first side surface 1c along the first direction D1, and are disposed on a part of the first principal surface 1a and a part of the second principal surface 1b. The first terminal electrode 11 is positioned close to the third side surface 1e. The third terminal electrode 13 is positioned close to the fourth side surface 1f.

The second terminal electrode 12 and the fourth terminal electrode 14 are disposed on the second side surface 1d side of the element body 1. The second terminal electrode 12 and the fourth terminal electrode 14 are disposed on another end portion of the element body 1 in the second direction D2. The second terminal electrode 12 and the fourth terminal electrode 14 are disposed on the second side surface 1d to cover a part of the second side surface 1d along the first direction D1, and are disposed on a part of the first principal surface 1a and a part of the second principal surface 1b. The second terminal electrode 12 is positioned close to the third side surface 1e. The fourth terminal electrode 14 is located close to the fourth side surface 1f.

As illustrated in FIG. 4, the first terminal electrode 11 includes a plurality of electrode portions 11a, 11b, and 11c. The electrode portion 11a is disposed on the first principal surface 1a. The electrode portion 11b is disposed on the second principal surface 1b. The electrode portion 11c is disposed on the first side surface 1c. The first terminal electrode 11 is not disposed on the second side surface 1d, the third side surface 1e, and the fourth side surface 1f. The first terminal electrode 11 is disposed only on the three surfaces 1a, 1b, and 1c. The electrode portions 11a, 11b, and 11c adjacent to one another are electrically connected at the ridge portion of the element body 1.

The electrode portion 11c covers the entire end of the first coil conductor 21, the end being exposed at the first side surface 1c. The first coil conductor 21 is connected with the electrode portion 11c at the end exposed at the first side surface 1c. The first terminal electrode 11 and the first coil conductor 21 are electrically connected to each other. The one end 21a of the first coil conductor 21 functions as a connection conductor with the first terminal electrode 11.

As illustrated in FIG. 4, the second terminal electrode 12 includes a plurality of electrode portions 12a, 12b, and 12c. The electrode portion 12a is disposed on the first principal surface 1a. The electrode portion 12b is disposed on the second principal surface 1b. The electrode portion 12c is disposed on the second side surface 1d. The second terminal electrode 12 is not disposed on the first side surface 1c, the third side surface 1e, and the fourth side surface 1f. The second terminal electrode 12 is disposed only on the three surfaces 1a, 1b, and 1d. The electrode portions 12a, 12b, and 12c adjacent to one another are electrically connected at the ridge portion of the element body 1.

The electrode portion 12c covers the entire end of the second coil conductor 22, the end being exposed at the second side surface 1d. The second coil conductor 22 is connected with the electrode portion 12c at the end exposed at the second side surface 1d. The second terminal electrode 12 and the second coil conductor 22 are electrically connected. The one end 22a of the second coil conductor 22 functions as a connection conductor with the second terminal electrode 12.

As illustrated in FIG. 5, the third terminal electrode 13 includes a plurality of electrode portions 13a, 13b, and 13c. The electrode portion 13a is disposed on the first principal surface 1a. The electrode portion 13b is disposed on the second principal surface 1b. The electrode portion 13c is disposed on the first side surface 1c. The third terminal electrode 13 is not disposed on the second side surface 1d, the third side surface 1e, and the fourth side surface 1f. The third terminal electrode 13 is disposed only on the three surfaces 1a, 1b, and 1c. The electrode portions 13a, 13b, and 13c adjacent to one another are electrically connected at the ridge portion of the element body 1.

The electrode portion 13c covers the entire end of the third coil conductor 23, the end being exposed at the first side surface 1c. The third coil conductor 23 is connected with the electrode portion 13c at the end exposed at the first side surface 1c. The third terminal electrode 13 and the third coil conductor 23 are electrically connected. The one end 23a of the third coil conductor 23 functions as a connection conductor with the third terminal electrode 13.

As illustrated in FIG. 5, the fourth terminal electrode 14 includes a plurality of electrode portions 14a, 14b, and 14c. The electrode portion 14a is disposed on the first principal surface 1a. The electrode portion 14b is disposed on the second principal surface 1b. The electrode portion 14c is disposed on the second side surface 1d. The fourth terminal electrode 14 is not disposed on the first side surface 1c, the third side surface 1e, and the fourth side surface 1f. The fourth terminal electrode 14 is disposed only on the three surfaces 1a, 1b, and 1d. The electrode portions 14a, 14b, and 14c adjacent to one another are electrically connected at the ridge portion of the element body 1.

The electrode portion 14c covers the entire end of the fourth coil conductor 24, the end being exposed at the second side surface 1d. The fourth coil conductor 24 is connected with the electrode portion 14c at the end exposed at the second side surface 1d. The fourth terminal electrode 14 and the fourth coil conductor 24 are electrically connected to each other. The one end 24a of the fourth coil conductor 24 functions as a connection conductor with the fourth terminal electrode 14.

Each of the first terminal electrode 11, the second terminal electrode 12, the third terminal electrode 13, and the fourth terminal electrode 14 includes a first electrode layer E1, a second electrode layer E2, a third electrode layer E3, and a fourth electrode layer E4. In the present embodiment, each of the electrode portions 11c, 12c, 13c, and 14c includes the first electrode layer E1, the second electrode layer E2, the third electrode layer E3, and the fourth electrode layer E4. Each of the electrode portions 11a, 11b, 12a, 12b, 13a, 13b, 14a, and 14b includes the second electrode layer E2, the third electrode layer E3, and the fourth electrode layer E4. Each of the electrode portions 11a, 11b, 12a, 12b, 13a, 13b, 14a, and 14b does not include the first electrode layer E1. The fourth electrode layer E4 configures each of uppermost layers of the first terminal electrode 11, the second terminal electrode 12, the third terminal electrode 13, and the fourth terminal electrode 14.

The first electrode layer E1 is formed by sintering conductive paste applied to the surface of the element body 1 (in the present embodiment, the first and second side surfaces 1c and 1d). The first electrode layer E1 is formed by sintering a metal component (metal powder) contained in the conductive paste. The first electrode layer E1 is a sintered metal layer. The first electrode layer E1 is a sintered metal layer disposed on the element body 1.

The first electrode layer E1 is included in each of the electrode portions 11c, 12c, 13c, and 14c. The first electrode layer E1 included in each of the electrode portions 11c and 13c is disposed on the first side surface 1c and is in contact with the first side surface 1c. The first electrode layer E1 included in each of the electrode portions 12c and 14c is disposed on the second side surface 1d and is in contact with the second side surface 1d. In the present embodiment, the first electrode layer E1 is not disposed on the first and second principal surfaces 1a and 1b.

The first electrode layer E1 included in the electrode portion 11c is connected with the one end 21a of the first coil conductor 21. The first electrode layer E1 included in the electrode portion 12c is connected with the one end 22a of the second coil conductor 22. The first electrode layer E1 included in the electrode portion 13c is connected with the one end 23a of the third coil conductor 23. The first electrode layer E1 included in the electrode portion 14c is connected with the one end 24a of the fourth coil conductor 24.

In the present embodiment, the first electrode layer E1 is a sintered metal layer made of Ag. The first electrode layer E1 may be a sintered metal layer made of Pd. The conductive paste includes powder made of Ag or Pd, a glass component, an organic binder, and an organic solvent.

The second electrode layer E2 is a conductive resin layer. The conductive resin layer is formed by curing a conductive resin paste, for example. The conductive resin paste includes a thermosetting resin, a conductive material, and an organic solvent, for example. The conductive material is metal powder, for example. The metal powder is Ag powder, for example. The thermosetting resin is a phenol resin, an acrylic resin, a silicone resin, an epoxy resin, or a polyimide resin, for example.

The third electrode layer E3 is a plating layer and is formed on the second electrode layer E2 by a plating method. In the present embodiment, the third electrode layer E3 is a Ni plating layer formed by Ni plating. The third electrode layer E3 may be a Cu plating layer.

The fourth electrode layer E4 is a plating layer and is formed on the third electrode layer E3 by a plating method. In the present embodiment, the fourth electrode layer E4 is a Sn plating layer formed by Sn plating. The third electrode layer E3 and the fourth electrode layer E4 configure a plating layer disposed on the second electrode layer E2. In the present embodiment, the plating layer formed on the second electrode layer E2 has a two-layer structure.

The second electrode layer E2 is integrally formed in each of the electrode portions 11a to 11c, 12a to 12c, 13a to 13c, and 14a to 14c. The third electrode layer E3 is integrally formed in each of the electrode portions 11a to 11c, 12a to 12c, 13a to 13c, and 14a to 14c. The fourth electrode layer E4 is integrally formed in each of the electrode portions 11a to 11c, 12a to 12c, 13a to 13c, and 14a to 14c.

In each of the electrode portions 11a to 11c, 12a to 12c, 13a to 13c, and 14a to 14c, the entire second electrode layer E2 is covered with the plating layer configured from the third electrode layer E3 and the fourth electrode layer E4.

The multilayer common mode filter CF1 is mounted to an electronic device (for example, a circuit board or an electronic component) by soldering. In the multilayer common mode filter CF1, the first principal surface 1a is arranged to constitute a mounting surface opposing the electronic device.

As illustrated in FIGS. 2, 4 and 5, the multilayer common mode filter CF1 includes one resin film I. The resin film I has electrical insulation properties. The resin film I is disposed on the first principal surface 1a and is in contact with the first principal surface 1a. In the present embodiment, the resin film I covers the entire first principal surface 1a.

The resin film I covers an edge $E1_e$ (end) of the first electrode layer E1, the edge $E1_e$ being close to the first principal surface 1a, and is in contact with the edge of the first electrode layer E1. That is, the end of the resin film I in the second direction D2 is positioned on the first electrode layer E1. The resin film I includes a region I1 overlapping with the first electrode layer E1. The region I1 of the resin film I is in contact with the first electrode layer E1.

The second electrode layer E2 included in each of the electrode portions 11a, 12a, 13a, and 14a is disposed on the resin film I and is in contact with the resin film I. The second electrode layer E2 included in each of the electrode portions 11a, 12a, 13a, and 14a is disposed on the first principal surface 1a of the element body 1 in such a manner that the resin film I is interposed between the second electrode layer E2 and the element body 1. The second electrode layer E2 included in each of the electrode portions 11a, 12a, 13a, and 14a is not in contact with the element body 1 (first principal surface 1a). The electrode portions 11a, 12a, 13a, and 14a are formed on the resin film I and are positioned on the resin film I. The second electrode layer E2 included in each of the electrode portions 11b, 12b, 13b, and 14b is disposed on the second principal surface 1b to be in contact with the second principal surface 1b.

The region I1 of the resin film I is positioned under the second electrode layer E2 included in each of the electrode portions 11a, 12a, 13a, and 14a and overlaps with the second electrode layer E2. Therefore, the region I1 of the resin film I is sandwiched between the first electrode layer E1 and the second electrode layer E2. The region I1 of the resin film I is in contact with the second electrode layer E2 included in each of the electrode portions 11a, 12a, 13a, and 14a.

The resin film I is in contact with the second electrode layer E2 included in each of the electrode portions 11a, 12a, 13a, and 14a of the four first to fourth terminal electrodes 11, 12, 13, and 14. The resin film I is also in contact with the first electrode layer E1 included in each of the electrode portions 11a, 12a, 13a, and 14a of the four first to fourth terminal electrodes 11, 12, 13, and 14.

The resin film I is made of an insulating resin, for example. The insulating resin is an epoxy resin, for example. The resin film I is formed by curing an applied insulating resin coating agent, for example. For application of the insulating resin coating agent, a screen printing method or a spray coating method is used, for example. The insulating resin coating agent is a thermosetting insulating resin coating agent, an ultraviolet curable insulating resin coating agent, or a coating agent containing both of the aforementioned insulating resin coating agents, for example.

Figure 6:
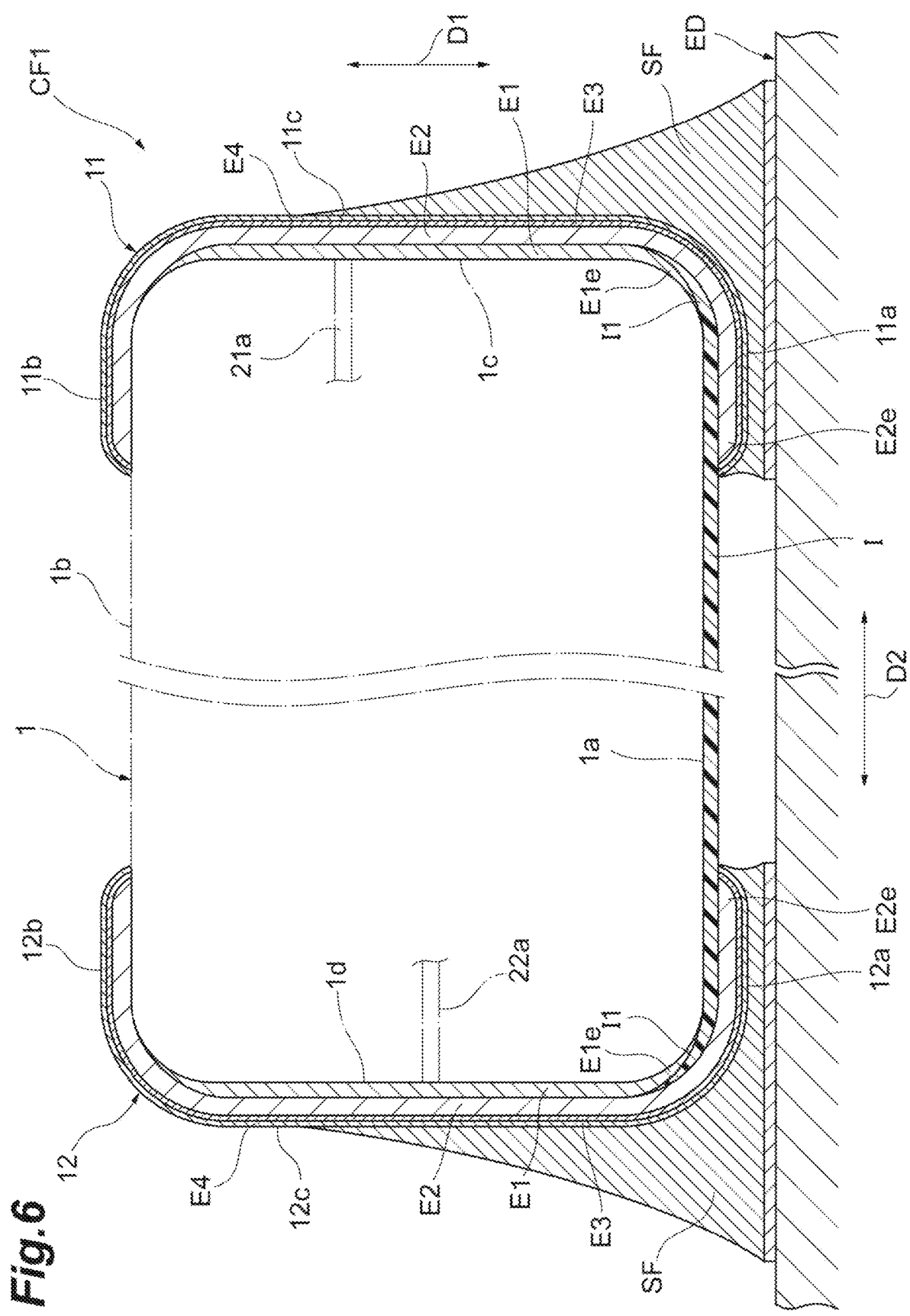
FIG. 6 is a diagram illustrating a mounting structure of the multilayer common mode filter according to the first embodiment.
Figure 7:
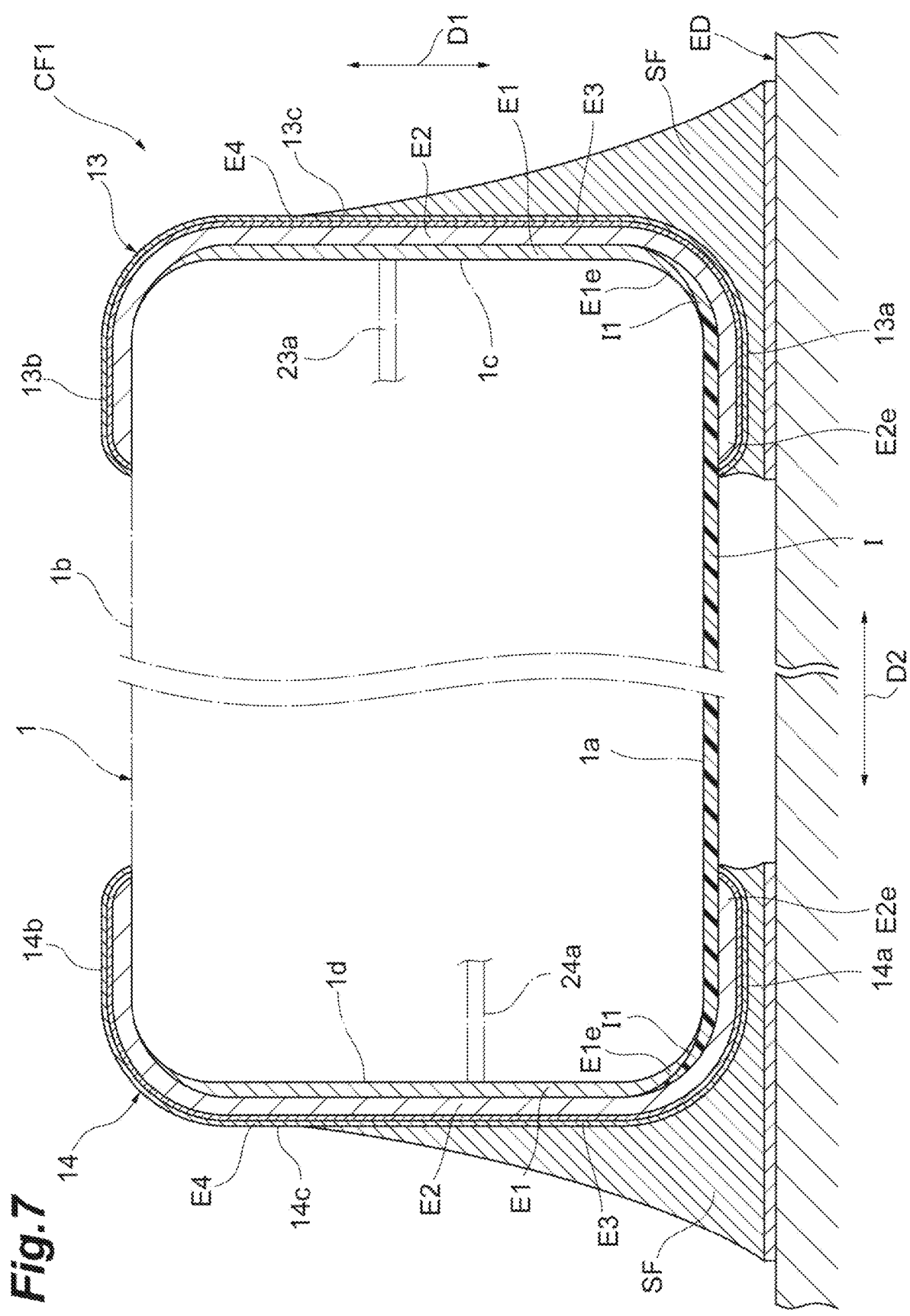
FIG. 7 is a diagram illustrating a mounting structure of the multilayer common mode filter according to the first embodiment.

As illustrated in FIGS. 6 and 7, the multilayer common mode filter CF1 is mounted to an electronic device ED by soldering. The electronic device ED is a circuit board or an electronic component, for example. A solder fillet SF is formed on the first terminal electrode 11, the second terminal electrode 12, the third terminal electrode 13, and the fourth terminal electrode 14 as the melted solder is solidified. FIGS. 6 and 7 are diagrams illustrating a mounting structure of the multilayer common mode filter according to the present embodiment.

When the multilayer common mode filter CF1 is mounted to the electronic device ED by soldering, an external force acting on the multilayer common mode filter CF1 from the electronic device ED acts as a stress on the element body 1 through the solder fillet SF and the terminal electrodes 11 to 14. The external force tends to act on the element body 1 from the electrode portions 11a, 12a, 13a, and 14a.

In the multilayer common mode filter CF1, the electrode portions 11a, 12a, 13a, and 14a include the second electrode layer E2. Therefore, even if the external force acts on the multilayer common mode filter CF1, the external force is reduced by the second electrode layer E2. A stress tends not to occur in the element body 1. As a result, occurrence of cracks in the element body 1 is suppressed.

In the multilayer common mode filter CF1, the second electrode layer E2 included in each of the electrode portions 11a, 12a, 13a, and 14a is in contact with the resin film I in contact with the first principal surface 1a. The resin film I is interposed between the second electrode layer E2 included in each of the electrode portions 11a, 12a, 13a, and 14a and the first principal surface 1a. Unlike the second electrode layer E2, the resin film I does not contain a conductive material (metal powder), and has high adhesive strength with the element body 1. Like the resin film I, the second electrode layer E2 contains a resin, and thus has high adhesive strength with the resin film I. Therefore, in the multilayer common mode filter CF1, even if an external force acts on the multilayer common mode filter CF1, the second electrode layer E2 included in each of the electrode portions 11a, 12a, 13a, and 14a tends not to peel off.

The second electrode layer E2 included in each of the electrode portions 11a, 12a, 13a, and 14a is entirely in contact with the resin film I. Therefore, the adhesive strength between the second electrode layer E2 and the resin film I is even higher.

The second electrode layer E2 included in each of the electrode portions 11a, 12a, 13a, and 14a may be partially in contact with the resin film I. An edge $E2_e$ (end) of the second electrode layer E2 in the second direction D2 may become a starting point from which the second electrode layer E2 peels off. Therefore, when the edge $E2_e$ of the second electrode layer E2 in the second direction D2 is in contact with the resin film I, the effect to suppress peeling of the second electrode layer E2 included in each of the electrode portions 11a, 12a, 13a, and 14a is secured.

The multilayer common mode filter CF1 includes the first coil conductor 21, the second coil conductor 22, the third coil conductor 23, and the fourth coil conductor 24. The electrode portions 11c, 12c, 13c, 14c include the first electrode layer E1. The second electrode layer E2 included in each of the electrode portions 11c, 12c, 13c, and 14c is disposed on the element body 1 in such a manner that the first electrode layer E1 is interposed between the second electrode layer E2 and the element body 1. Each of the first coil conductor 21, the second coil conductor 22, the third coil conductor 23, and the fourth coil conductor 24 is electrically connected to the corresponding second electrode layer E2 through the corresponding first electrode layer E1. Therefore, in the multilayer common mode filter CF1, connection strength between the coil conductors 21 to 24 and the respective terminal electrodes 11 to 14 is high, as compared with in a multilayer common mode filter in which each of the first coil conductor 21, the second coil conductor 22, the third coil conductor 23, and the fourth coil conductor 24 is directly connected with the corresponding second electrode layer E2. The coil conductors 21 to 24 and the respective terminal electrodes 11 to 14 are reliably electrically connected.

The resin film I covers the edge E1$_e$ of the first electrode layer E1, the edge E1$_e$ being close to the first principal surface 1a, and is in contact with the edge E1$_e$ of the first electrode layer E1. Therefore, the end (region I1) of the resin film I is sandwiched between the first electrode layer E1 and the second electrode layer E2. As a result, the resin film I tends not to peel off.

In the multilayer common mode filter CF1, the first terminal electrode 11 and the third terminal electrode 13 are disposed on the first side surface 1c side of the element body 1. The first terminal electrode 11 and the third terminal electrode 13 are not formed to cover the entire first side surface 1c. The surface area of each of the first terminal electrode 11 and the third terminal electrode 13 must be small. The second terminal electrode 12 and the fourth terminal electrode 14 are disposed on the second side surface 1d side of the element body 1. The surface area of each of the second terminal electrode 12 and the fourth terminal electrode 14 must be small. Therefore, the area of the second electrode layer E2 is small, and the adhesive strength of the second electrode layer E2 may be decreased. However, in the multilayer common mode filter CF1, the second electrode layer E2 included in each of the electrode portions 11a, 12a, 13a, and 14a is in contact with the resin film I in contact with the first principal surface 1a.

Therefore, the second electrode layer E2 included in each of the electrode portions 11a, 12a, 13a, and 14a tends not to peel off.

In the present embodiment, the resin film I is in contact with the second electrode layer E2 included in each of the electrode portions 11a, 12a, 13a, and 14a of the four first to fourth terminal electrodes 11, 12, 13, and 14. Therefore, in the multilayer common mode filter CF1, formation of the resin film I is easy.

Figure 8:
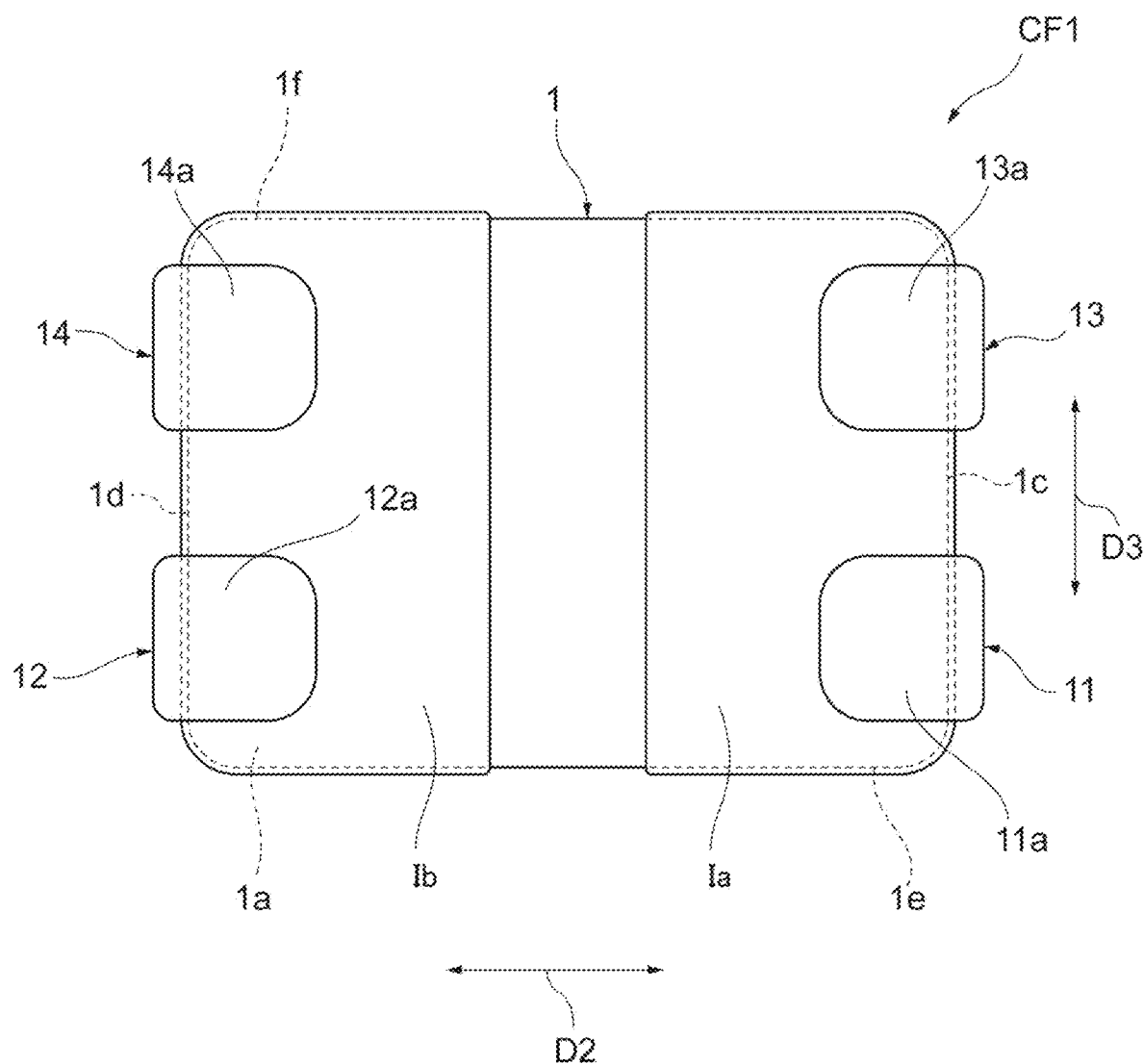
FIG. 8 is a plan view illustrating a multilayer common mode filter according to a modification of the first embodiment.
Figure 9:
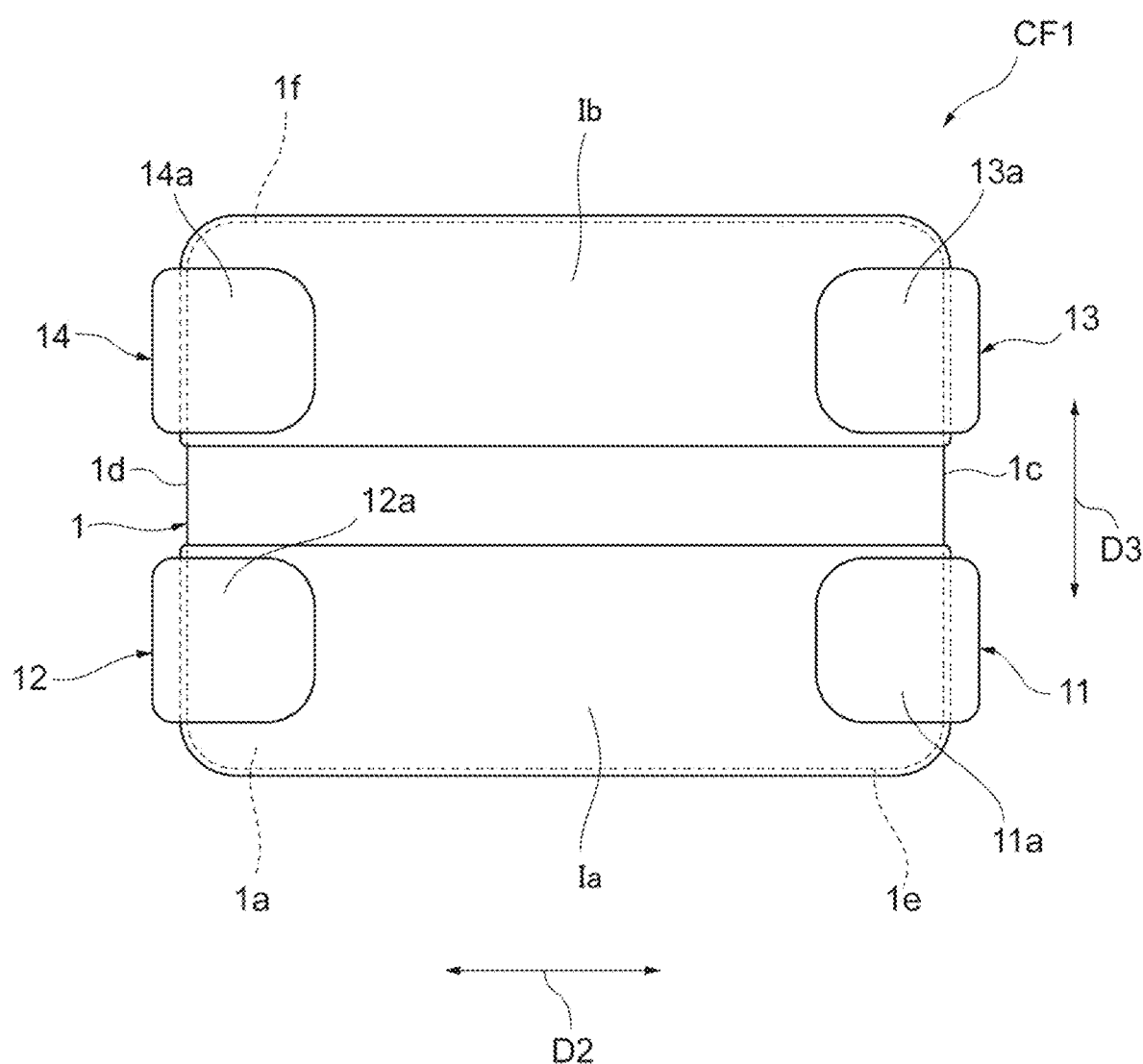
FIG. 9 is a plan view illustrating a multilayer common mode filter according to a modification of the first embodiment.
Figure 10:
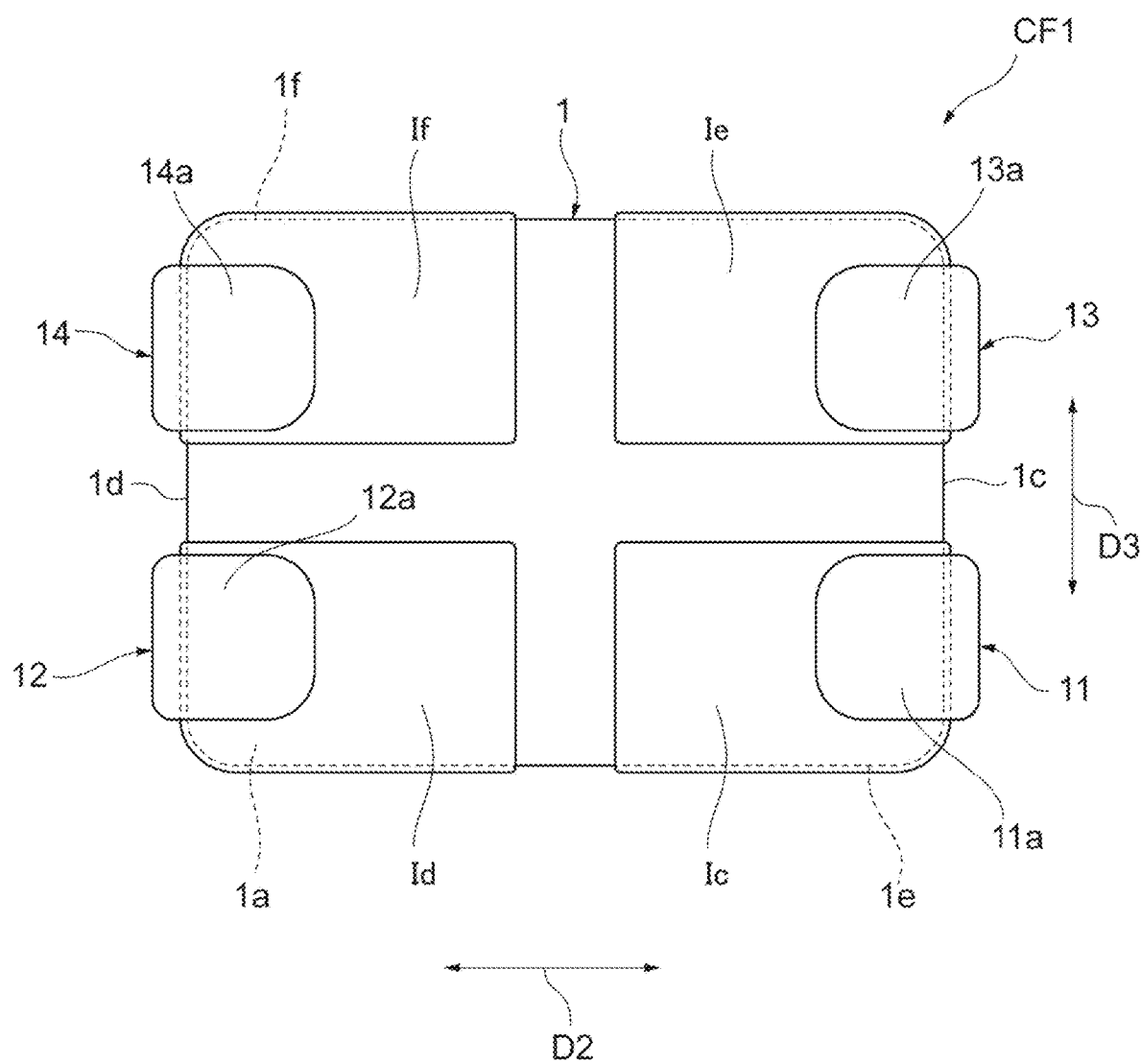
FIG. 10 is a plan view illustrating a multilayer common mode filter according to a modification of the first embodiment.

Next, configurations of multilayer common mode filters CF1 according to modifications of the first embodiment will be described with reference to FIGS. 8 to 10. FIGS. 8 to 10 are plan views of multilayer common mode filters according to the modifications. In each of the modifications, the shape of a resin film is different from the above-described multilayer common mode filter CF1.

The multilayer common mode filter CF1 illustrated in FIG. 8 includes two resin films Ia and Ib. The two resin films Ia and Ib are separated in a second direction D2. A first principal surface 1a is exposed between the resin film Ia and the resin film Ib. The resin film Ia is in contact with a second electrode layer E2 included in each of electrode portions 11a and 13a of two first and third terminal electrodes 11 and 13. The two first and third terminal electrodes 11 and 13 are adjacent to each other in a third direction D3. The resin film Ib is in contact with a second electrode layer E2 included in each of electrode portions 12a and 14a of two second and fourth terminal electrodes 12 and 14. The two second and fourth terminal electrodes 12 and 14 are adjacent to each other in the third direction D3.

The multilayer common mode filter CF1 illustrated in FIG. 9 includes two resin films Ia and Ib. The two resin films Ia and Ib are separated in a third direction D3. A first principal surface 1a is exposed between the resin film Ia and the resin film Ib. The resin film Ia is in contact with a second electrode layer E2 included in each of electrode portions 11a and 12a of two first and second terminal electrodes 11 and 12. The two first and second terminal electrodes 11 and 12 are adjacent to each other in a second direction D2. The resin film Ib is in contact with a second electrode layer E2 included in each of electrode portions 13a and 14a of two third and fourth terminal electrodes 13 and 14. The two third and fourth terminal electrodes 13 and 14 are adjacent to each other in the second direction D2.

In each of the multilayer common mode filters CF1 of the modifications illustrated in FIGS. 8 and 9, the second electrode layer E2 included in each of the electrode portions 11a, 12a, 13a, and 14a tends not to peel off. Formation of a resin film I is easy.

The multilayer common mode filter CF1 illustrated in FIG. 10 includes four resin films Ic, Id, Ie, and If. The four resin films Ic, Id, Ie, and If are provided for respective first to fourth terminal electrodes 11, 12, 13, and 14. The four resin films Ic, Id, Ie and If are separated from one another. The resin film Ic is in contact with a second electrode layer E2 included in an electrode portion 11a of the first terminal electrode 11. The resin film Id is in contact with a second electrode layer E2 included in an electrode portion 12a of the second terminal electrode 12. The resin film Ie is in contact with a second electrode layer E2 included in an electrode portion 13a of the third terminal electrode 13. The resin film If is in contact with a second electrode layer E2 included in an electrode portion 14a of the fourth terminal electrode 14.

In the multilayer common mode filter CF1 of the modification illustrated in FIG. 10, the second electrode layer E2 included in each of the electrode portions 11a, 12a, 13a, and 14a tends not to peel off. In the present modification, the resin films Ic, Id, Ie, and If are provided for the respective first to fourth terminal electrodes 11, 12, 13, and 14. The resin films Ic, Id, Ie and If are in contact with the second electrode layers E2 included in the corresponding electrode portions 11a, 12a, 13a, and 14a. Therefore, the amount of resin used for forming the resin films Ic, Id, Ie, and If is reduced.

Figure 11:
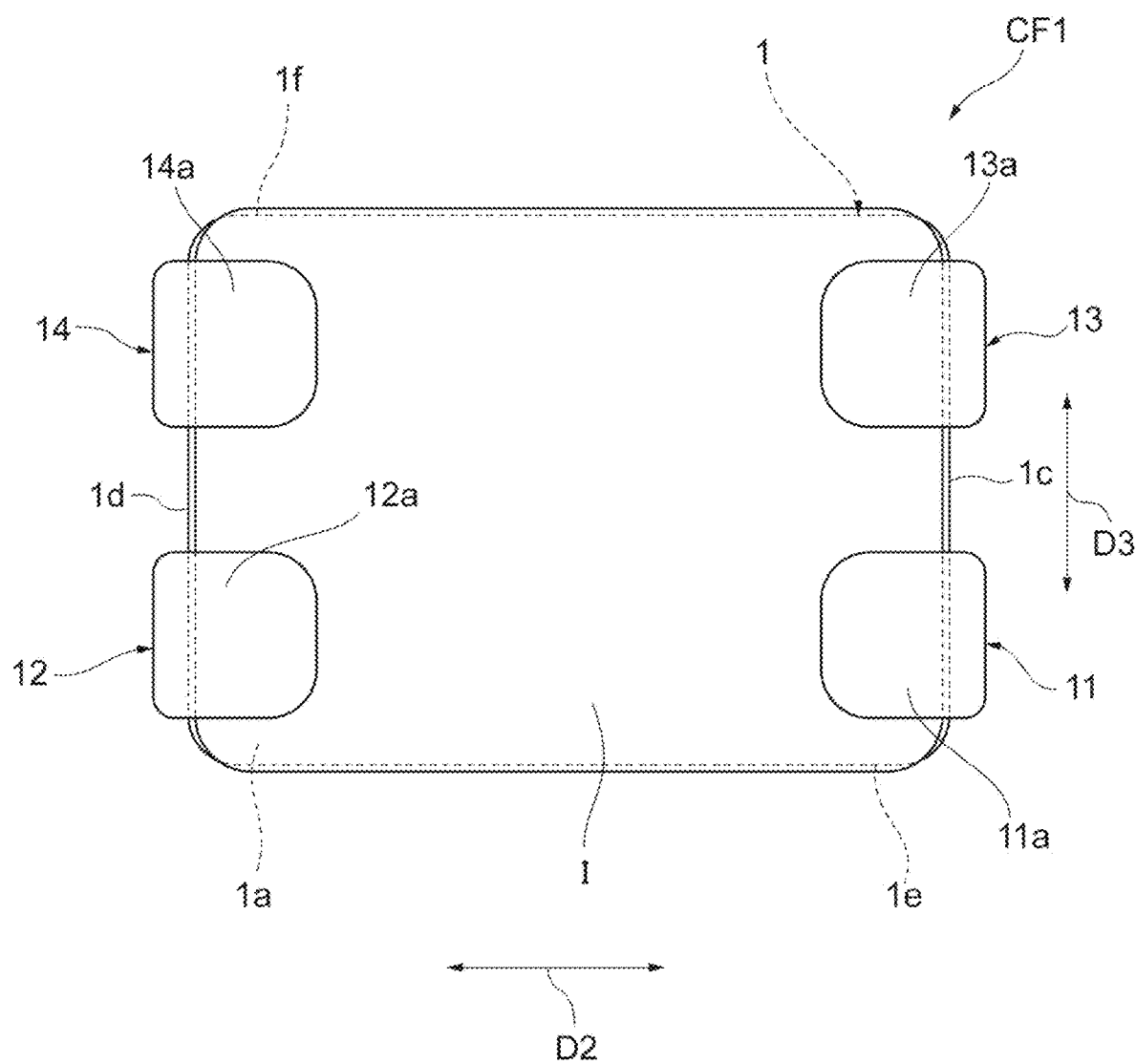
FIG. 11 is a plan view illustrating a multilayer common mode filter according to a modification of the first embodiment.
Figure 12:
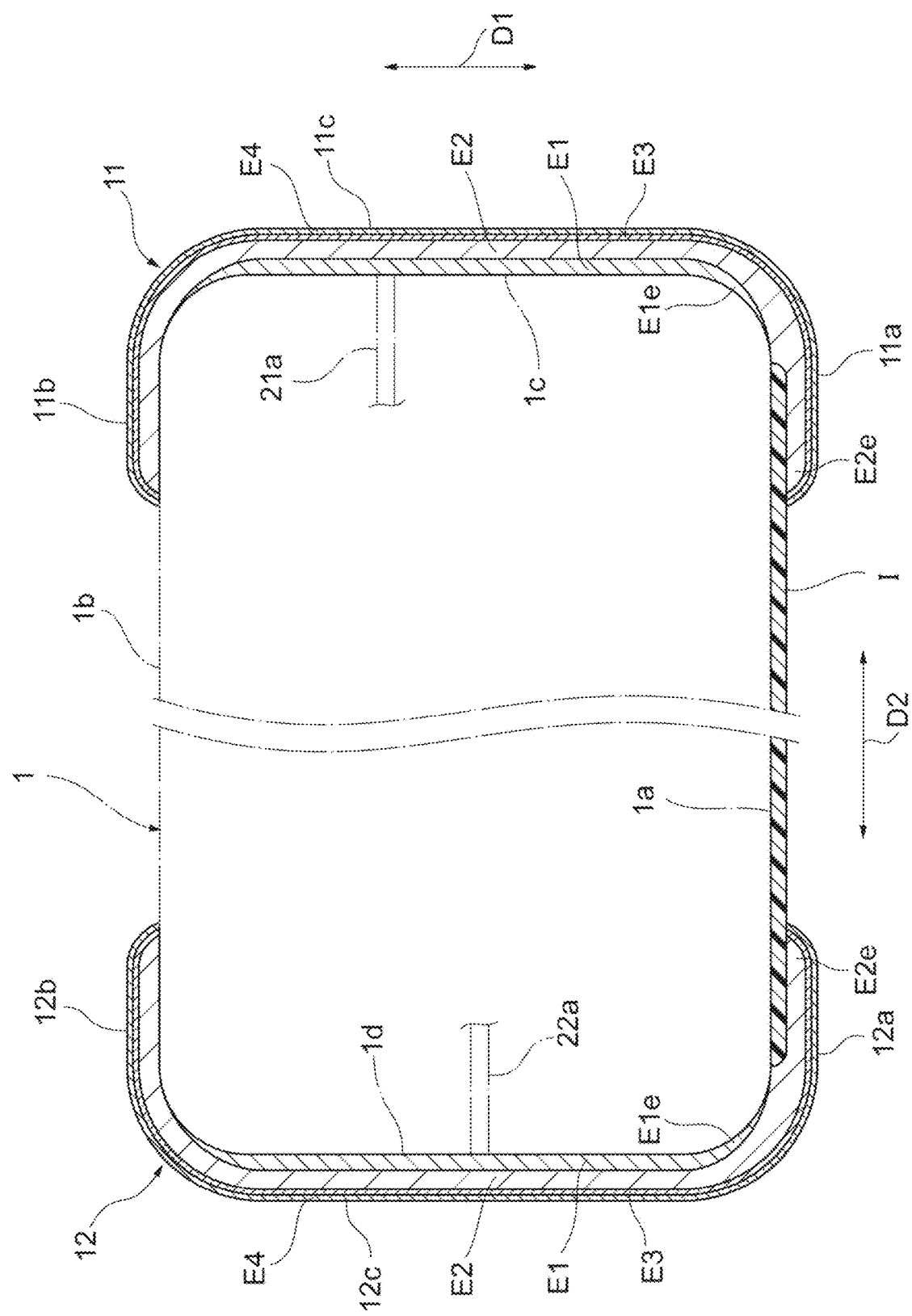
FIG. 12 is a diagram illustrating a cross-sectional configuration of a first terminal electrode, a second terminal electrode, and a resin layer.
Figure 13:
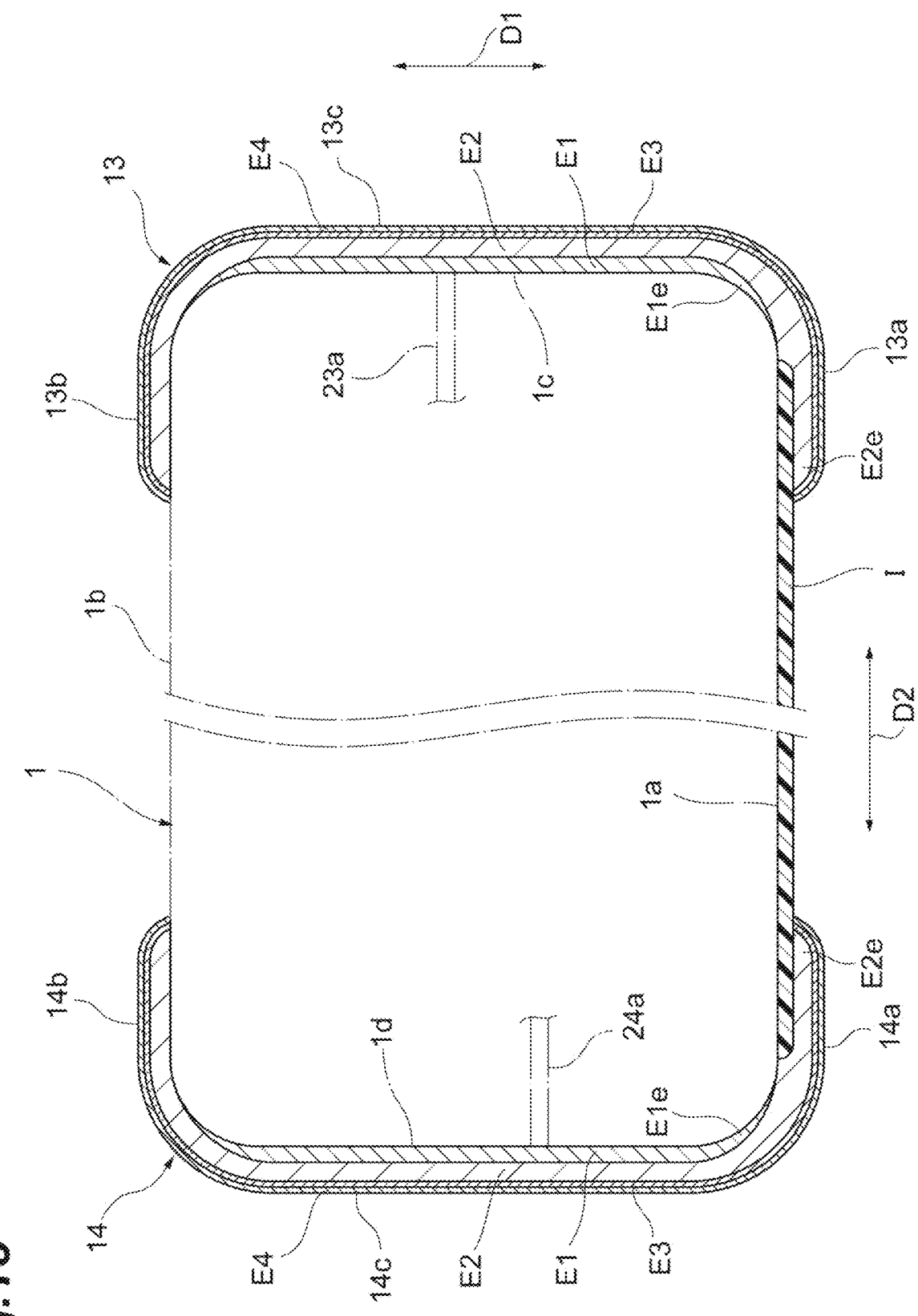
FIG. 13 is a diagram illustrating a cross-sectional configuration of a third terminal electrode, a fourth terminal electrode, and a resin layer.

Next, a configuration of the multilayer common mode filter CF1 according to a modification of the first embodiment will be described with reference to FIGS. 11 to 13. FIG. 11 is a plan view of the multilayer common mode filter CF1 according to the present modification. FIG. 12 is a diagram illustrating a cross-sectional configuration of a first terminal electrode, a second terminal electrode, and a resin layer. FIG. 13 is a diagram illustrating a cross-sectional configuration of a third terminal electrode, a fourth terminal electrode, and a resin layer.

As illustrated in FIGS. 11 to 13, a resin film I may not be in contact with a first electrode layer E1. In the present modification, the entire resin film I is in contact with a first principal surface 1a. The resin film I is separated from the first electrode layer E1 and is not in contact with the first electrode layer E1. Even in the present modification, a second electrode layer E2 (edge E2$_e$) included in each of electrode portions 11a, 12a, 13a, 14a is in contact with the resin film I in contact with the first principal surface 1a. Therefore, even if an external force acts on the multilayer common mode filter CF1, the second electrode layer E2 included in each of the electrode portions 11a, 12a, 13a, and 14a tends not to peel off.

The first embodiment and the modifications described above may include the following configurations.

The multilayer common mode filter CF1 may include another resin film disposed on the second principal surface 1b. In which case, the other resin film is in contact with the second principal surface 1b. The second electrode layer E2 included in each of the electrode portions 11b, 12b, 13b, and 14b may be disposed on the other resin film. In which case, the second electrode layer E2 included in each of the electrode portions 11*b*, 12*b*, 13*b*, and 14*b* is in contact with the other resin film. In the present configuration, the second electrode layer E2 included in each of the electrode portions 11*b*, 12*b*, 13*b*, and 14*b* tends not to peel off.

The other resin film may cover an edge (end) of the first electrode layer E1, the edge being close to the second principal surface 1*b*. In which case, the other resin film is in contact with the edge of the first electrode layer E1, the edge being close to the second principal surface 1*b*. In the present configuration, an end of the other resin film is sandwiched between the first electrode layer E1 and the second electrode layer E2. As a result, the other resin film tends not to peel off. The other resin film may not be in contact with the first electrode layer E1.

The first terminal electrode 11, the second terminal electrode 12, the third terminal electrode 13, and the fourth terminal electrode 14 do not necessarily include the electrode portions 11*b*, 12*b*, 13*b*, and 14*b*. The first terminal electrode 11 and the third terminal electrode 13 may be disposed only on the two surfaces 1*a* and 1*c*, and the second terminal electrode 12 and the fourth terminal electrode 14 may be disposed only on the two surfaces 1*a* and 1*d*.

The plating layer disposed on the second electrode layer E2 does not necessarily have the two-layer structure including the third electrode layer E3 and the fourth electrode layer E4. The plating layer disposed on the second electrode layer E2 may be one layer or three or more layers. The plating layer disposed on the second electrode layer E2 may have a three-layer structure including a Ni plating layer, a Cu plating layer formed on the Ni plating layer, and a Sn plating layer formed on the Cu plating layer, or a three-layer structure including a Cu plating layer, a Ni plating layer formed on the Cu plating layer, and a Sn plating layer formed on the Ni plating layer.

The number of the terminal electrodes disposed on each of the end portions of the element body 1 in the second direction D2 is not limited to "two." The number of the terminal electrodes disposed on each of the end portions of the element body 1 in the second direction D2 may be "three or more".

Second Embodiment

Figure 14:
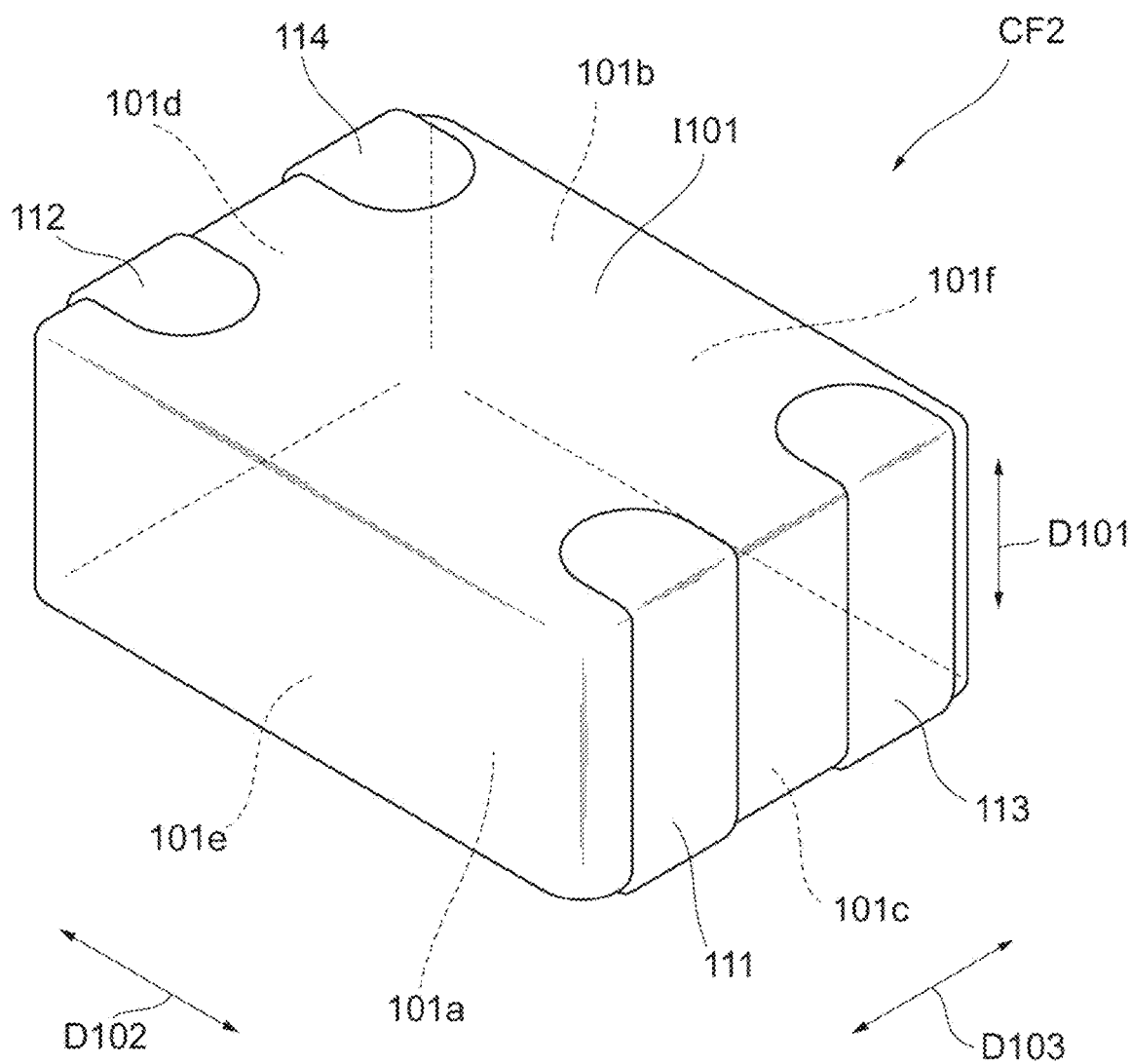
FIG. 14 is a perspective view illustrating a multilayer common mode filter according to a second embodiment.
Figure 15:
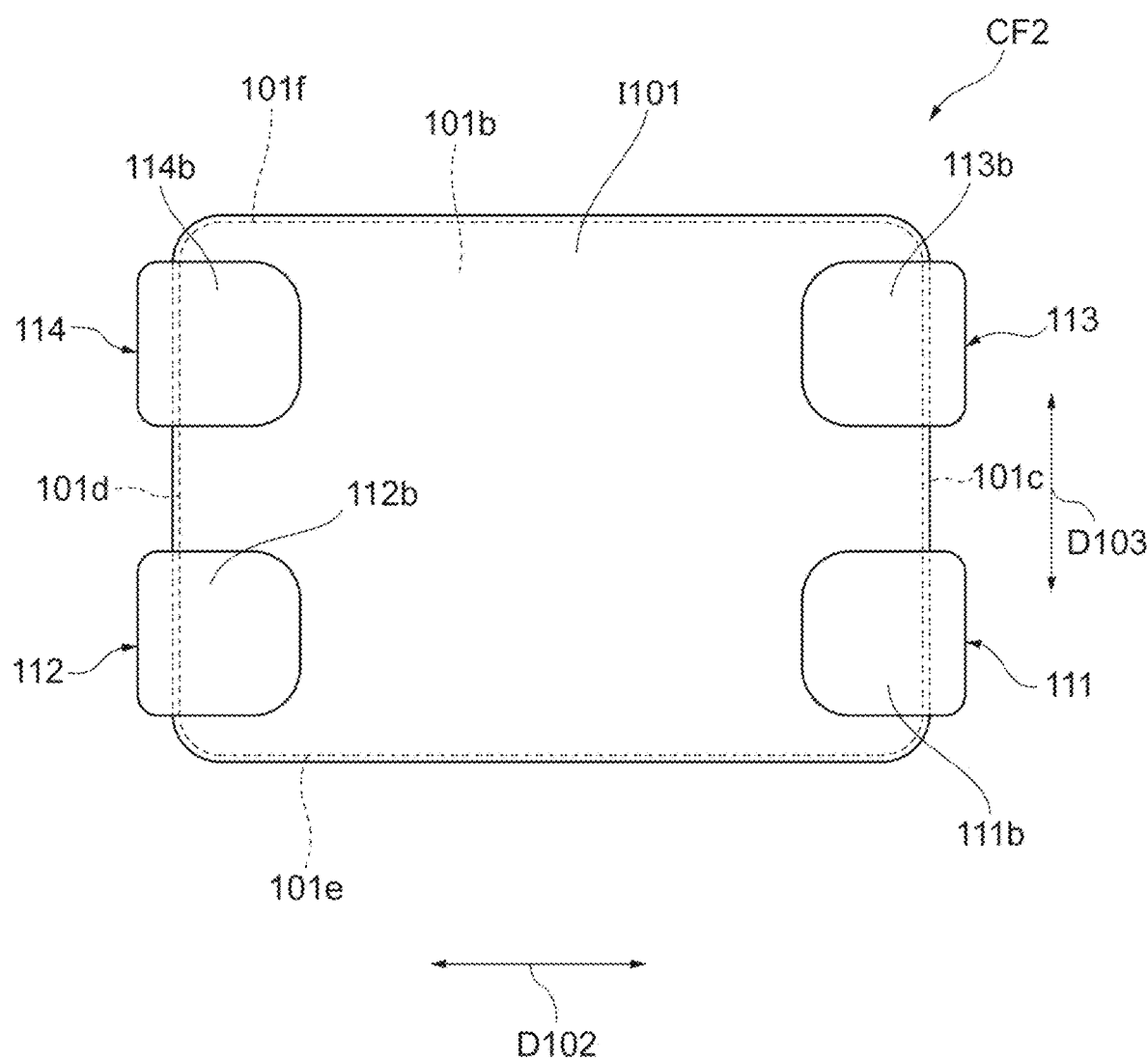
FIG. 15 is a plan view illustrating the multilayer common mode filter according to the second embodiment.
Figure 16:
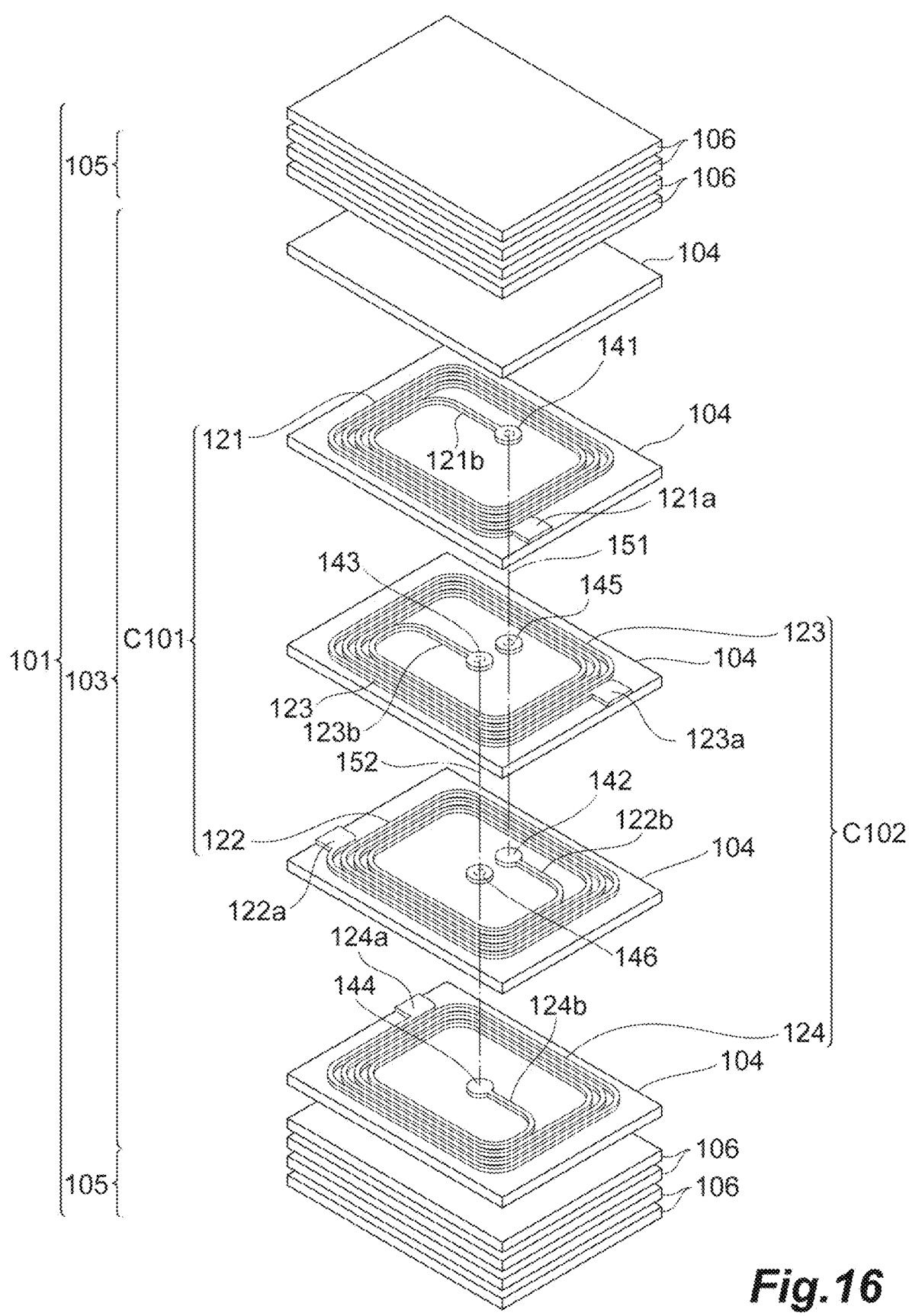
FIG. 16 is an exploded perspective view illustrating a configuration of an element body.
Figure 17:
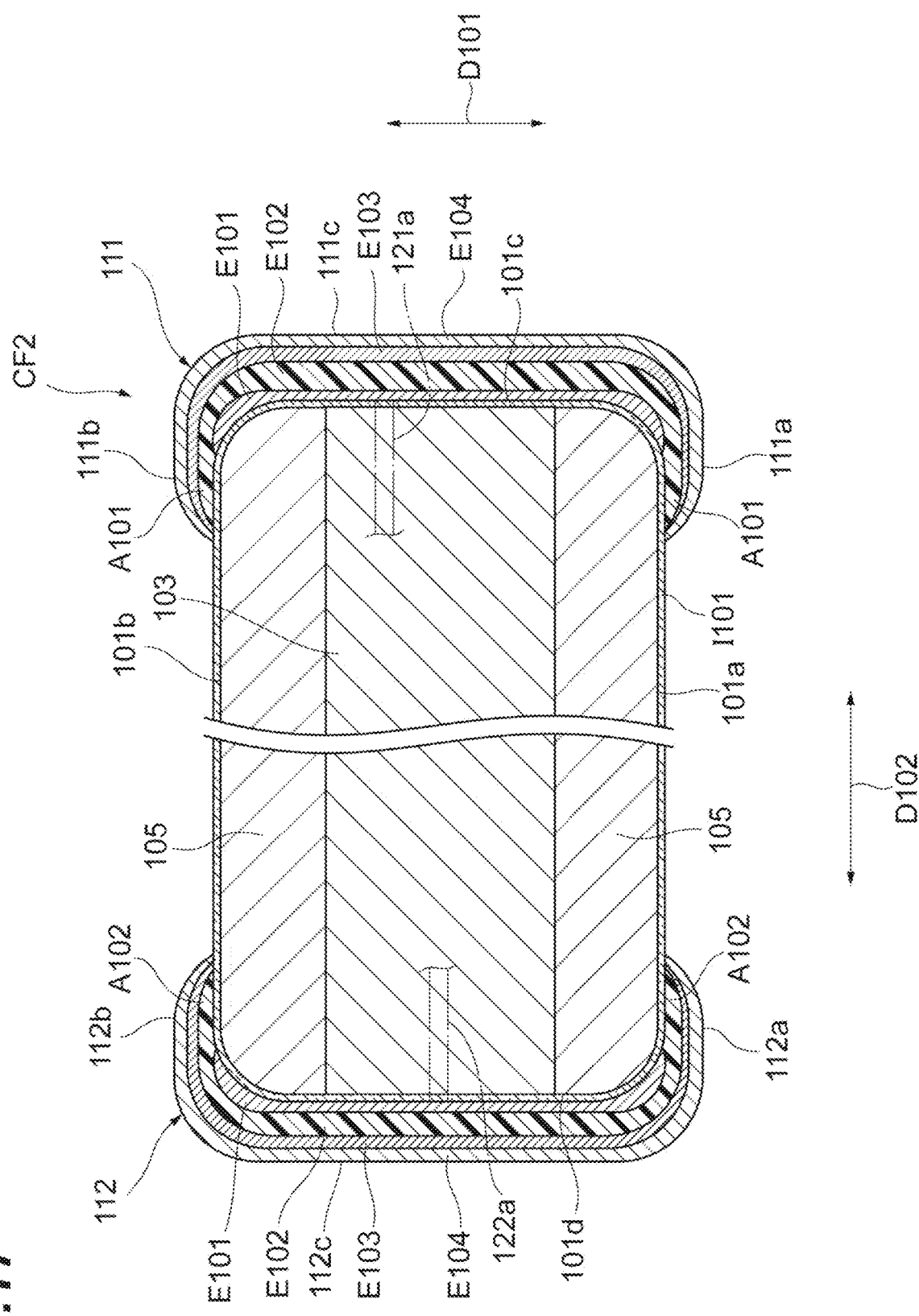
FIG. 17 is a diagram illustrating a cross-sectional configuration of the multilayer common mode filter according to the second embodiment.
Figure 18:
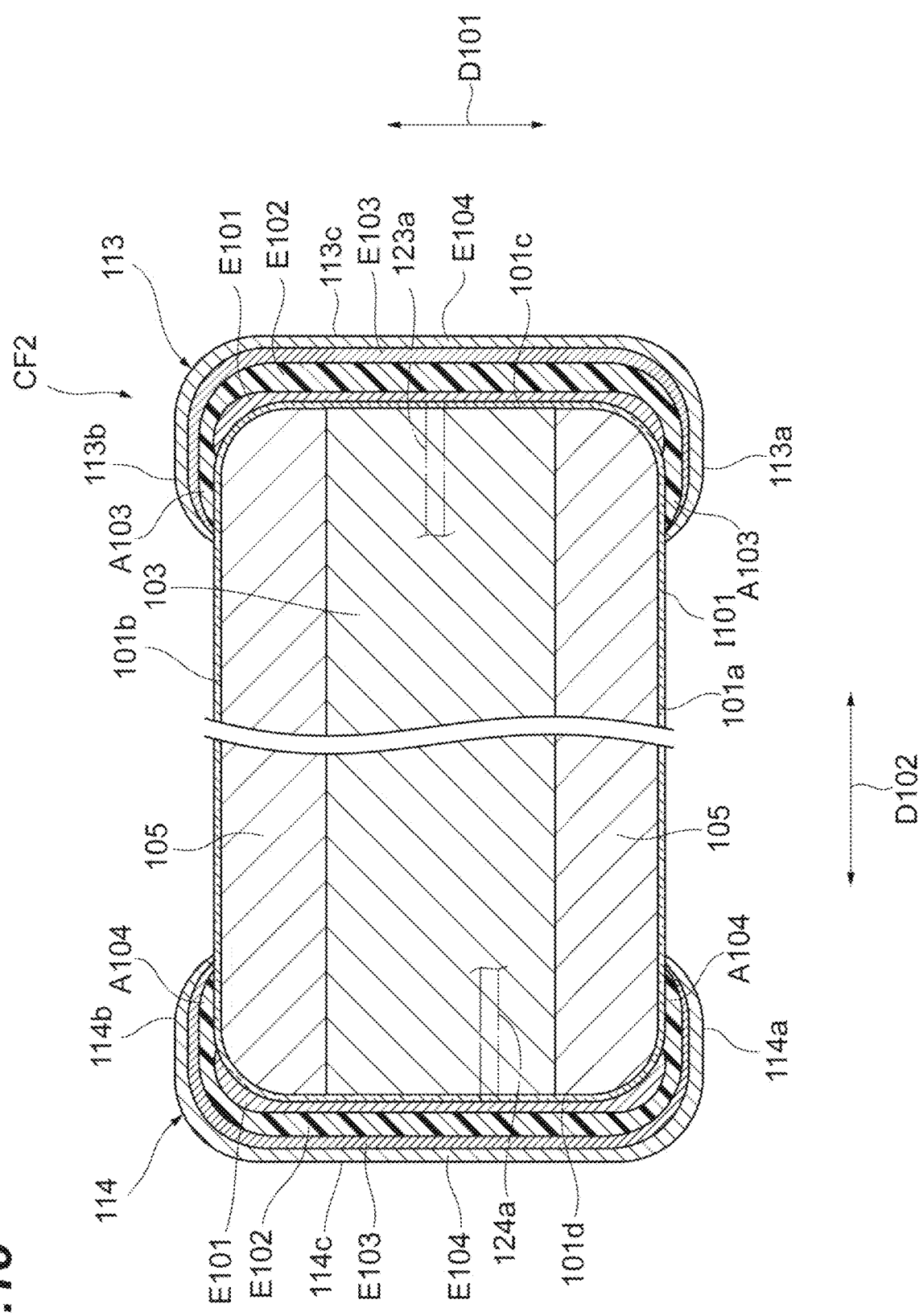
FIG. 18 is a diagram illustrating a cross-sectional configuration of the multilayer common mode filter according to the second embodiment.

A configuration of a multilayer common mode filter CF2 according to a second embodiment will be described with reference to FIGS. 14 to 18. FIG. 14 is a perspective view illustrating a multilayer common mode filter according to a second embodiment. FIG. 15 is a plan view illustrating the multilayer common mode filter according to the second embodiment. FIG. 16 is an exploded perspective view illustrating a configuration of an element body. FIG. 17 is a diagram illustrating a cross-sectional configuration of the multilayer common mode filter according to the second embodiment. FIG. 18 is a diagram illustrating a cross-sectional configuration of the multilayer common mode filter according to the second embodiment. In the present embodiment, an electronic component is the multilayer common mode filter CF2, for example.

As illustrated in FIGS. 14 to 16, the multilayer common mode filter CF2 includes an element body 101, an external electrode, and an amorphous glass layer I101. The external electrode includes a first terminal electrode 111, a second terminal electrode 112, a third terminal electrode 113, and a fourth terminal electrode 114. The first terminal electrode 111, the second terminal electrode 112, the third terminal electrode 113, and the fourth terminal electrode 114 are disposed on an external surface of the element body 101. Like the multilayer common mode filter CF1, the multilayer common mode filter CF2 includes the element body 101, the first terminal electrode 111, the second terminal electrode 112, the third terminal electrode 113, and the fourth terminal electrode 114. The multilayer common mode filter CF2 is mounted on an electronic device by soldering in such a manner that the first terminal electrode 11, the second terminal electrode 12, the third terminal electrode 13, and the fourth terminal electrode 14 are separately connected to signal lines.

The element body 101 has a rectangular parallelepiped shape. The element body 101 includes a first principal surface 101*a* and a second principal surface 101*b* opposing each other, a first side surface 101*c* and a second side surface 101*d* opposing each other, and a third side surface 101*e* and a fourth side surface 101*f* opposing each other. A direction in which the first principal surface 101*a* and the second principal surface 101*b* oppose each other is a first direction D101. A direction in which the first side surface 101*c* and the second side surface 101*d* oppose each other is a second direction D102. A direction in which the third side surface 101*e* and the fourth side surface 101*f* oppose each other is a third direction D103. In the present embodiment, the first direction D101 is a height direction of the element body 101. The second direction D102 is a longitudinal direction of the element body 101. The third direction D103 is a width direction of the element body 101. The rectangular parallelepiped shape includes a shape of a rectangular parallelepiped in which a corner portion and a ridge portion are chamfered and a shape of a rectangular parallelepiped in which a corner portion and a ridge portion are rounded.

The first side surface 101*c* and the second side surface 101*d* extend in the first direction D101 to connect the first principal surface 101*a* and the second principal surface 101*b*. The first side surface 101*c* and the second side surface 101*d* are adjacent to the first principal surface 101*a* and are also adjacent to the second principal surface 101*b*. The first side surface 101*c* and the second side surface 101*d* also extend in the third direction D103. The third direction D103 is also a short side direction of the first principal surface 101*a* and the second principal surface 101*b*.

The third side surface 101*e* and the fourth side surface 101*f* extend in the first direction D101 to connect the first principal surface 101*a* and the second principal surface 101*b*. The first side surface 101*c* and the second side surface 101*d* are adjacent to the first principal surface 101*a* and are also adjacent to the second principal surface 101*b*. The third side surface 101*e* and the fourth side surface 101*f* also extend in the second direction D102. The second direction D102 is also a long side direction of the first principal surface 101*a* and the second principal surface 101*b*.

The element body 101 includes a non-magnetic portion 103 and a pair of magnetic portions 105. The pair of magnetic portions 105 is disposed to sandwich the non-magnetic portion 103 in the first direction D101. The element body 101 includes a plurality of laminated insulating layers. In the non-magnetic portion 103, a plurality of non-magnetic layers 104 are laminated. The non-magnetic portion 103 includes the plurality of laminated non-magnetic layers 104. In each of the magnetic portions 105, a plurality of magnetic layers 106 are laminated. Each of the magnetic portions 105 includes the plurality of laminated magnetic layers 106. The plurality of insulating layers include the plurality of non-magnetic layers 104 and the plurality of magnetic layers 106.

Each of the non-magnetic layers 104 is configured by a sintered body of a ceramic green sheet including a non-magnetic material, for example. The non-magnetic material is a Cu—Zn based ferrite material, a dielectric material, or a glass ceramic material, for example. Each of the magnetic layers 106 is configured by a sintered body of a ceramic green sheet including a magnetic material, for example. The magnetic material is a Ni—Cu—Zn based ferrite material, a Ni—Cu—Zn—Mg based ferrite material, or a Ni—Cu based ferrite material, for example. In the present embodiment, each of the magnetic portions 105 is made of the ferrite material.

In the actual element body 101, the non-magnetic layers 104 and the magnetic layers 106 are integrated in such a manner that inter-layer boundaries cannot be visualized. The first direction D101 (the direction in which the first principal surface 101a and the second principal surface 101b oppose each other) is matched with a direction in which the plurality of insulating layers (the plurality of non-magnetic layers 104 and the plurality of magnetic layers 106) are laminated. Hereinafter, the direction in which the plurality of insulating layers are laminated is simply referred to as a "lamination direction".

The multilayer common mode filter CF2 is mounted to an electronic device (for example, a circuit board or an electronic component) by soldering. In the multilayer common mode filter CF2, the first principal surface 101a or the second principal surface 101b is arranged to constitute a mounting surface opposing the electronic device.

The multilayer common mode filter CF2 includes the amorphous glass layer I101. The amorphous glass layer I101 is formed on a surface of the element body 101. The amorphous glass layer I101 covers the element body 101 (the non-magnetic portion 103 and the magnetic portions 105). The amorphous glass layer I101 is in contact with the surface (the first and second principal surfaces 101a and 101b and the first to fourth side surfaces 101c, 101d, 101e, and 101f) of the element body 110. The amorphous glass layer I101 covers the first and second principal surfaces 101a and 101b, the first and second side surfaces 101c and 101d, and the third and fourth side surfaces 101e and 101f. The amorphous glass layer I101 covers the entire surface of the element body 110. Surfaces of the magnetic portions 105 include the first and second principal surfaces 101a and 101b. Therefore, the amorphous glass layer I101 is formed on the surfaces of the magnetic portions 105.

Figure 19B:
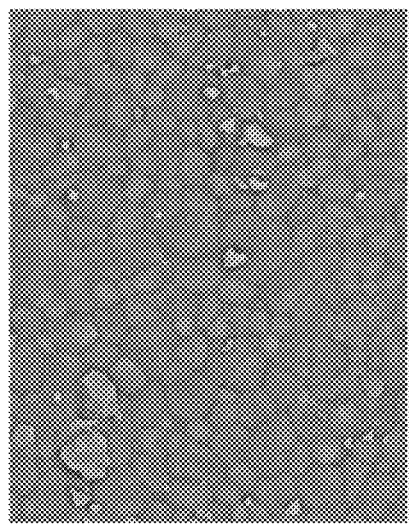
FIG. 19B is a view illustrating a surface of an amorphous glass coat layer.
Figure 19A:
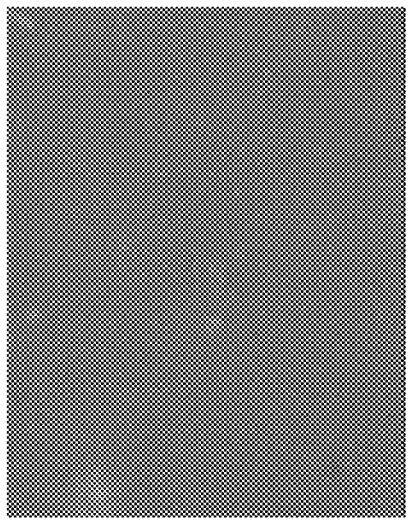
FIG. 19A is a view illustrating a surface of a magnetic portion.

As illustrated in FIGS. 19A and 19B, surface roughness of the amorphous glass layer I101 is smaller than surface roughness of the magnetic portion 105. The amorphous glass layer I101 is made of an amorphous glass material. The amorphous glass material is silica based glass ($SiO_2$—$B_2O_3$—$ZrO_2$—$R_2O$ based glass), for example. FIG. 19A illustrates an example of the surface of the magnetic portion 105. FIG. 19B illustrates an example of the surface of the amorphous glass layer I101. In FIGS. 19A and 19B, the respective surfaces are magnified at the same magnification.

As illustrated in FIG. 16, the multilayer common mode filter CF2 includes a first coil conductor 121, a second coil conductor 122, a third coil conductor 123, and a fourth coil conductor 124 in the non-magnetic portion 103. The first coil conductor 121, the second coil conductor 122, the third coil conductor 123, and the fourth coil conductor 124 are internal conductors disposed in the element body 101. The first to fourth coil conductors 121 to 124 include a conductive material (for example, Ag or Pd). The first to fourth coil conductors 121 to 124 are configured as sintered bodies of conductive paste including a conductive material (for example, Ag powder or Pd powder).

The first coil conductor 121 has a spiral shape and is disposed between a pair of the non-magnetic layers 104 adjacent to each other in the lamination direction. One end (outside end) 121a of the first coil conductor 121 is exposed at the first side surface 101c. Another end (inside end) 121b of the first coil conductor 121 is connected to a first pad conductor 141. The first pad conductor 141 is located at the same layer as the first coil conductor 121. In the present embodiment, the first coil conductor 121 and the first pad conductor 141 are integrally formed.

The second coil conductor 122 has a spiral shape and is disposed between a pair of the non-magnetic layers 104 adjacent to each other in the lamination direction. One end (outside end) 122a of the second coil conductor 122 is exposed at the second side surface 101d. Another end (inside end) 122b of the second coil conductor 122 is connected to a second pad conductor 142. The second pad conductor 142 is located at the same layer as the second coil conductor 122. In the present embodiment, the second coil conductor 122 and the second pad conductor 142 are integrally formed.

The third coil conductor 123 has a spiral shape and is disposed between a pair of the non-magnetic layers 104 adjacent to each other in the lamination direction. One end (outside end) 123a of the third coil conductor 123 is exposed at the first side surface 101c. Another end (inside end) 123b of the third coil conductor 123 is connected to a third pad conductor 143. The third pad conductor 143 is located at the same layer as the third coil conductor 123. In the present embodiment, the third coil conductor 123 and the third pad conductor 143 are integrally formed.

The fourth coil conductor 124 has a spiral shape and is disposed between a pair of the non-magnetic layers 104 adjacent to each other in the lamination direction. One end (outside end) 124a of the fourth coil conductor 124 is exposed at the second side surface 101d. Another end (inside end) 124b of the fourth coil conductor 124 is connected to a fourth pad conductor 144. The fourth pad conductor 144 is located at the same layer as the fourth coil conductor 124. In the present embodiment, the fourth coil conductor 124 and the fourth pad conductor 144 are integrally formed.

The first coil conductor 121 and the third coil conductor 123 are adjacent to each other in the lamination direction in a state where the non-magnetic layer 104 is interposed between the first coil conductor 121 and the third coil conductor 123. The non-magnetic layer 104 is sandwiched between the first coil conductor 121 and the third coil conductor 123. The second coil conductor 122 and the fourth coil conductor 124 are adjacent to each other in the lamination direction in a state where the non-magnetic layer 104 is interposed between the second coil conductor 122 and the fourth coil conductor 124. The non-magnetic layer 104 is sandwiched between the second coil conductor 122 and the fourth coil conductor 124. The third coil conductor 123 is positioned between the first coil conductor 121 and the second coil conductor 122 in the lamination direction. The first to fourth coil conductors 121 to 124 are disposed in the order of the first coil conductor 121, the third coil conductor 123, the second coil conductor 122, and the fourth coil conductor 124 in the lamination direction. The first to fourth coil conductors 121 to 124 are wound in the same direction and are positioned to overlap each other, when viewed from the lamination direction.

The first pad conductor 141 and the second pad conductor 142 are positioned to overlap each other when viewed from the lamination direction. A fifth pad conductor 145 is disposed between the first pad conductor 141 and the second pad conductor 142 to overlap the first and second pad conductors 141 and 142 when viewed from the lamination direction. The fifth pad conductor 145 is located at the same layer as the third coil conductor 123. The first pad conductor 141 and the fifth pad conductor 145 are adjacent to each other in the lamination direction in a state where the non-magnetic layer 104 is interposed between the first pad conductor 141 and the fifth pad conductor 145. The non-magnetic layer 104 is sandwiched between the first pad conductor 141 and the fifth pad conductor 145. The fifth pad conductor 145 and the second pad conductor 142 are adjacent to each other in the lamination direction in a state where the non-magnetic layer 104 is interposed between the fifth pad conductor 145 and the second pad conductor 142. The non-magnetic layer 104 is sandwiched between the fifth pad conductor 145 and the second pad conductor 142.

The first pad conductor 141, the fifth pad conductor 145, and the second pad conductor 142 are connected through a first through-hole conductor 151. The first through-hole conductor 151 penetrates the non-magnetic layer 104 positioned between the first pad conductor 141 and the fifth pad conductor 145, and the non-magnetic layer 104 positioned between the fifth pad conductor 145 and the second pad conductor 142.

The third pad conductor 143 and the fourth pad conductor 144 are positioned to overlap each other when viewed from the lamination direction. A sixth pad conductor 146 is disposed between the third pad conductor 143 and the fourth pad conductor 144 to overlap the third and fourth pad conductors 143 and 144 when viewed from the lamination direction. The sixth pad conductor 146 is located at the same layer as the second coil conductor 122. The third pad conductor 143 and the sixth pad conductor 146 are adjacent to each other in the lamination direction in a state where the non-magnetic layer 104 is interposed between the third pad conductor 143 and the sixth pad conductor 146. The non-magnetic layer 104 is sandwiched between the third pad conductor 143 and the sixth pad conductor 146. The sixth pad conductor 146 and the fourth pad conductor 144 are adjacent to each other in the lamination direction in a state where the non-magnetic layer 104 is interposed between the sixth pad conductor 146 and the fourth pad conductor 144. The non-magnetic layer 104 is sandwiched between the sixth pad conductor 146 and the fourth pad conductor 144.

The third pad conductor 143, the sixth pad conductor 146, and the fourth pad conductor 144 are connected through a second through-hole conductor 152. The second through-hole conductor 152 penetrates the non-magnetic layer 104 positioned between the third pad conductor 143 and the sixth pad conductor 146, and the non-magnetic layer 104 positioned between the sixth pad conductor 146 and the fourth pad conductor 144.

The first coil conductor 121 and the second coil conductor 122 are electrically connected through the first pad conductor 141, the fifth pad conductor 145, the second pad conductor 142, and the first through-hole conductor 151. The first coil conductor 121 and the second coil conductor 122 configure a first coil C101. The third coil conductor 123 and the fourth coil conductor 124 are electrically connected through the third pad conductor 143, the sixth pad conductor 146, the fourth pad conductor 144, and the second through-hole conductor 152. The third coil conductor 123 and the fourth coil conductor 124 configure a second coil C102.

The multilayer common mode filter CF2 includes the first coil C101 and the second coil C102 in the element body 101 (non-magnetic portion 103). The first coil C101 and the second coil C102 are disposed in the non-magnetic portion 103 in such a manner that the first coil conductor 121 and the third coil conductor 123 are adjacent to each other in the lamination direction, the third coil conductor 123 and the second coil conductor 122 are adjacent to each other in the lamination direction, and the second coil conductor 122 and the fourth coil conductor 124 are adjacent to each other in the lamination direction. The first coil C101 and the second coil C102 are arranged to be magnetically coupled to each other.

The fifth and sixth pad conductors 145 and 146 and the first and second through-hole conductors 151 and 152 include a conductive material (for example, Ag or Pd). The fifth and sixth pad conductors 145 and 146 and the first and second through-hole conductors 151 and 152 are configured as a sintered body of conductive paste containing a conductive material (for example, Ag powder or Pd powder). The first and second through-hole conductors 151 and 152 are formed by sintering conductive paste filled in through-holes formed in ceramic green sheets that configure the corresponding non-magnetic layers 104.

The first terminal electrode 111 and the third terminal electrode 113 are disposed on the first side surface 101c side of the element body 101. The first terminal electrode 111 and the third terminal electrode 113 are disposed on one end portion of the element body 101 in the second direction D102. The first terminal electrode 111 and the third terminal electrode 113 are disposed on the first side surface 101c to cover a part of the first side surface 101c along the first direction D101, and are disposed on a part of the first principal surface 101a and a part of the second principal surface 101b. The first terminal electrode 111 is positioned close to the third side surface 101e. The third terminal electrode 113 is positioned close to the fourth side surface 101f.

The second terminal electrode 112 and the fourth terminal electrode 114 are disposed on the second side surface 101d side of the element body 101. The second terminal electrode 112 and the fourth terminal electrode 114 are disposed on another end portion of the element body 101 in the second direction D102. The second terminal electrode 112 and the fourth terminal electrode 114 are disposed on the second side surface 101d to cover a part of the second side surface 101d along the first direction D101, and are disposed on a part of the first principal surface 101a and a part of the second principal surface 101b. The second terminal electrode 112 is positioned close to the third side surface 101e. The fourth terminal electrode 114 is located close to the fourth side surface 101f.

As illustrated in FIG. 17, the first terminal electrode 111 includes a plurality of electrode portions 111a, 111b, and 111c. The electrode portion 111a is disposed on the first principal surface 101a. The electrode portion 111b is disposed on the second principal surface 101b. The electrode portion 111c is disposed on the first side surface 101c. The first terminal electrode 111 is not disposed on the second side surface 101d, the third side surface 101e, and the fourth side surface 101f. The first terminal electrode 111 is disposed only on the three surfaces 101a, 101b, and 101c. The electrode portions 111a, 111b, and 111c adjacent to one another are electrically connected at the ridge portion of the element body 101.

The electrode portion 111c covers the entire end of the first coil conductor 121, the end being exposed at the first side surface 101c. The first coil conductor 121 is connected with the electrode portion 111c at the end exposed at the first side surface 101c. The first terminal electrode 111 and the first coil conductor 121 are electrically connected to each other. The one end 121a of the first coil conductor 121 functions as a connection conductor with the first terminal electrode 111.

As illustrated in FIG. 17, the second terminal electrode 112 includes a plurality of electrode portions 112a, 112b, and 112c. The electrode portion 112a is disposed on the first principal surface 101a. The electrode portion 112b is disposed on the second principal surface 101b. The electrode portion 112c is disposed on the second side surface 101d. The second terminal electrode 112 is not disposed on the first side surface 101c, the third side surface 101e, and the fourth side surface 101f. The second terminal electrode 112 is disposed only on the three surfaces 101a, 101b, and 101d. The electrode portions 112a, 112b, and 112c adjacent to one another are electrically connected at the ridge portion of the element body 101.

The electrode portion 112c covers the entire end of the second coil conductor 122, the end being exposed at the second side surface 101d. The second coil conductor 122 is connected with the electrode portion 112c at the end exposed at the second side surface 101d. The second terminal electrode 112 and the second coil conductor 122 are electrically connected. The one end 122a of the second coil conductor 122 functions as a connection conductor with the second terminal electrode 112.

As illustrated in FIG. 18, the third terminal electrode 113 includes a plurality of electrode portions 113a, 113b, and 113c. The electrode portion 113a is disposed on the first principal surface 101a. The electrode portion 113b is disposed on the second principal surface 101b. The electrode portion 113c is disposed on the first side surface 101c. The third terminal electrode 113 is not disposed on the second side surface 101d, the third side surface 101e, and the fourth side surface 101f. The third terminal electrode 113 is disposed only on the three surfaces 101a, 110b, and 101c. The electrode portions 113a, 113b, and 113c adjacent to one another are electrically connected at the ridge portion of the element body 101.

The electrode portion 113c covers the entire end of the third coil conductor 123, the end being exposed at the first side surface 101c. The third coil conductor 123 is connected with the electrode portion 113c at the end exposed at the first side surface 101c. The third terminal electrode 113 and the third coil conductor 123 are electrically connected. The one end 123a of the third coil conductor 123 functions as a connection conductor with the third terminal electrode 113.

As illustrated in FIG. 18, the fourth terminal electrode 114 includes a plurality of electrode portions 114a, 114b, and 114c. The electrode portion 114a is disposed on the first principal surface 101a. The electrode portion 114b is disposed on the second principal surface 101b. The electrode portion 114c is disposed on the second side surface 101d. The fourth terminal electrode 114 is not disposed on the first side surface 101c, the third side surface 101e, and the fourth side surface 101f. The fourth terminal electrode 114 is disposed only on the three surfaces 101a, 101b, and 101d. The electrode portions 114a, 114b, and 114c adjacent to one another are electrically connected at the ridge portion of the element body 101.

The electrode portion 114c covers the entire end of the fourth coil conductor 124, the end being exposed at the second side surface 101d. The fourth coil conductor 124 is connected with the electrode portion 114c at the end exposed at the second side surface 101d. The fourth terminal electrode 114 and the fourth coil conductor 124 are electrically connected to each other. The one end 124a of the fourth coil conductor 124 functions as a connection conductor with the fourth terminal electrode 114.

Each of the first terminal electrode 111, the second terminal electrode 112, the third terminal electrode 113, and the fourth terminal electrode 114 includes a first electrode layer E101, a second electrode layer E102, a third electrode layer E103, and a fourth electrode layer E104. In the present embodiment, each of the electrode portions 111c, 112c, 113c, and 114c includes the first electrode layer E101, the second electrode layer E102, the third electrode layer E103, and the fourth electrode layer E104. Each of the electrode portions 111a, 111b, 112a, 112b, 113a, 113b, 114a, and 114b includes the second electrode layer E102, the third electrode layer E103, and the fourth electrode layer E104. Each of the electrode portions 111a, 111b, 112a, 112b, 113a, 113b, 114a, and 114b does not include the first electrode layer E101. The fourth electrode layer E104 configures each of uppermost layers of the first terminal electrode 111, the second terminal electrode 112, the third terminal electrode 113, and the fourth terminal electrode 114.

The first electrode layer E101 is formed by sintering conductive paste. The first electrode layer E101 is formed by sintering a metal component (metal powder) contained in the conductive paste. The first electrode layer E101 is a sintered metal layer. In the present embodiment, the first electrode layer E101 is disposed on the amorphous glass layer I101. The first electrode layer E101 is disposed on the element body 101 in such a manner that the amorphous glass layer I101 is interposed between the first electrode layer E101 and the element body 101.

The first electrode layer E101 is included in each of the electrode portions 111c, 112c, 113c, and 114c. The first electrode layer E101 included in each of the electrode portions 111c and 113c is disposed on the first side surface 101c and is in contact with the first side surface 101c. The first electrode layer E101 included in each of the electrode portions 112c and 114c is disposed on the second side surface 101d and is in contact with the second side surface 101d. In the present embodiment, the first electrode layer E101 is not disposed on the first and second principal surfaces 101a and 101b.

The first electrode layer E101 included in the electrode portion 111c is connected with the one end 121a of the first coil conductor 121. The first electrode layer E101 included in the electrode portion 112c is connected with the one end 122a of the second coil conductor 122. The first electrode layer E101 included in the electrode portion 113c is connected with the one end 123a of the third coil conductor 123. The first electrode layer E101 included in the electrode portion 114c is connected with the one end 124a of the fourth coil conductor 124.

In the present embodiment, the first electrode layer E101 is a sintered metal layer made of Ag. The first electrode layer E101 may be a sintered metal layer made of Pd. The conductive paste includes powder made of Ag or Pd, a glass component, an organic binder, and an organic solvent.

The second electrode layer E102 is a conductive resin layer. The conductive resin layer is formed by curing a conductive resin paste, for example. The conductive resin paste includes a thermosetting resin, a conductive material, and an organic solvent, for example. The conductive material is metal powder, for example. The metal powder is Ag powder, for example. The thermosetting resin is a phenol resin, an acrylic resin, a silicone resin, an epoxy resin, or a polyimide resin, for example.

The third electrode layer E103 is a plating layer and is formed on the second electrode layer E102 by a plating method. In the present embodiment, the third electrode layer E103 is a Ni plating layer formed by Ni plating. The third electrode layer E103 may be a Cu plating layer.

The fourth electrode layer E104 is a plating layer and is formed on the third electrode layer E103 by a plating method. In the present embodiment, the fourth electrode layer E104 is a Sn plating layer formed by Sn plating. The third electrode layer E103 and the fourth electrode layer E104 configure a plating layer disposed on the second electrode layer E102. In the present embodiment, the plating layer formed on the second electrode layer E102 has a two-layer structure.

The second electrode layer E102 is integrally formed in each of the electrode portions 111a to 111c, 112a to 112c, 113a to 113c, and 114a to 114c. The third electrode layer E103 is integrally formed in each of the electrode portions 111a to 111c, 112a to 112c, 113a to 113c, and 114a to 114c. The fourth electrode layer E104 is integrally formed in each of the electrode portions 111a to 111c, 112a to 112c, 113a to 113c, and 114a to 114c.

The electrode portions 111a, 111b, 112a, 112b, 113a, 113b, 114a, and 114b include edges A101, A102, A103, and A104 of the corresponding second electrode layers E102. The electrode portions 111a, 111b, 112a, 112b, 113a, 113b, 114a, and 114b include edges of the corresponding third electrode layers E103. The electrode portions 111a, 111b, 112a, 112b, 113a, 113b, 114a, and 114b include edges of the corresponding fourth electrode layers E104.

The second electrode layer E102 is disposed on the first electrode layer E101 and is in contact with the first electrode layer E101 in each of the electrode portions 111c, 112c, 113c, and 114c. The second electrode layer E102 is not in direct contact with the element body 101. In each of the electrode portions 111a to 111c, 112a to 112c, 113a to 113c, and 114a to 114c, the entire second electrode layer E102 is covered with the plating layer configured from the third electrode layer E103 and the fourth electrode layer E104.

The multilayer common mode filter CF2 includes the first to fourth coil conductors 121, 122, 123, and 124 as described above. The first to fourth coil conductors 121, 122, 123, and 124 are disposed in the element body 101. The one end 121a of the first coil conductor 121 and the one end 123a of the third coil conductor 123 are exposed at the first side surface 101c. The one end 122a of the second coil conductor 122 and the one end 124a of the fourth coil conductor 124 are exposed at the second side surface 101d. Each of the electrode portions 111c, 112c, 113c, and 114c includes the first electrode layer E101.

The amorphous glass layer I101 is positioned between the edges A101, A102, A103, A104 of the second electrode layers E102 of the electrode portions 111a, 111b, 112a, 112b, 113a, 113b, 114a, and 114b, and the magnetic portions 105. In the present embodiment, the edges A101, A102, A103, and A104 of the second electrode layers E102 are in contact with the amorphous glass layer I101. The amorphous glass layer I101 is disposed between the first and second principal surfaces 101a and 101b, and the edges A101, A102, A103, and A104 of the second electrode layers E102. The amorphous glass layer I101 is sandwiched between the first and second principal surfaces 101a and 101b, and the edges A101, A102, A103, A104 of the second electrode layers E102.

The one end 121a of the first coil conductor 121 penetrates the amorphous glass layer I101 and is connected to the electrode portion 111c. The one end 122a of the second coil conductor 122 penetrates the amorphous glass layer I101 and is connected to the electrode portion 112c. The one end 123a of the third coil conductor 123 penetrates the amorphous glass layer I101 and is connected to the electrode portion 113c. The one end 124a of the fourth coil conductor 124 penetrates the amorphous glass layer I101 and is connected to the electrode portion 114c.

The second electrode layer E102 included in each of the electrode portions 111c, 112c, 113c, and 114c is disposed on the element body 101 in such a manner that the first electrode layer E101 and the amorphous glass layer I101 are interposed between the second electrode layer E102 and the element body 101. The second electrode layer E102 is in contact with the first electrode layer E101. The first coil conductor 121, the second coil conductor 122, the third coil conductor 123, and the fourth coil conductor 124 are electrically connected with the corresponding second electrode layer E102 through the corresponding first electrode layer E101. Therefore, in the multilayer common mode filter CF2, connection strength between the coil conductors 121 to 124 and the terminal electrodes 111 to 114 is high, as compared with in a multilayer common mode filter in which the first coil conductor 121, the second coil conductor 122, the third coil conductor 123, and the fourth coil conductor 124 are directly connected with the second electrode layers E102. The coil conductors 121 to 124 and the terminal electrodes 111 to 114 are reliably electrically connected.

Figure 20:
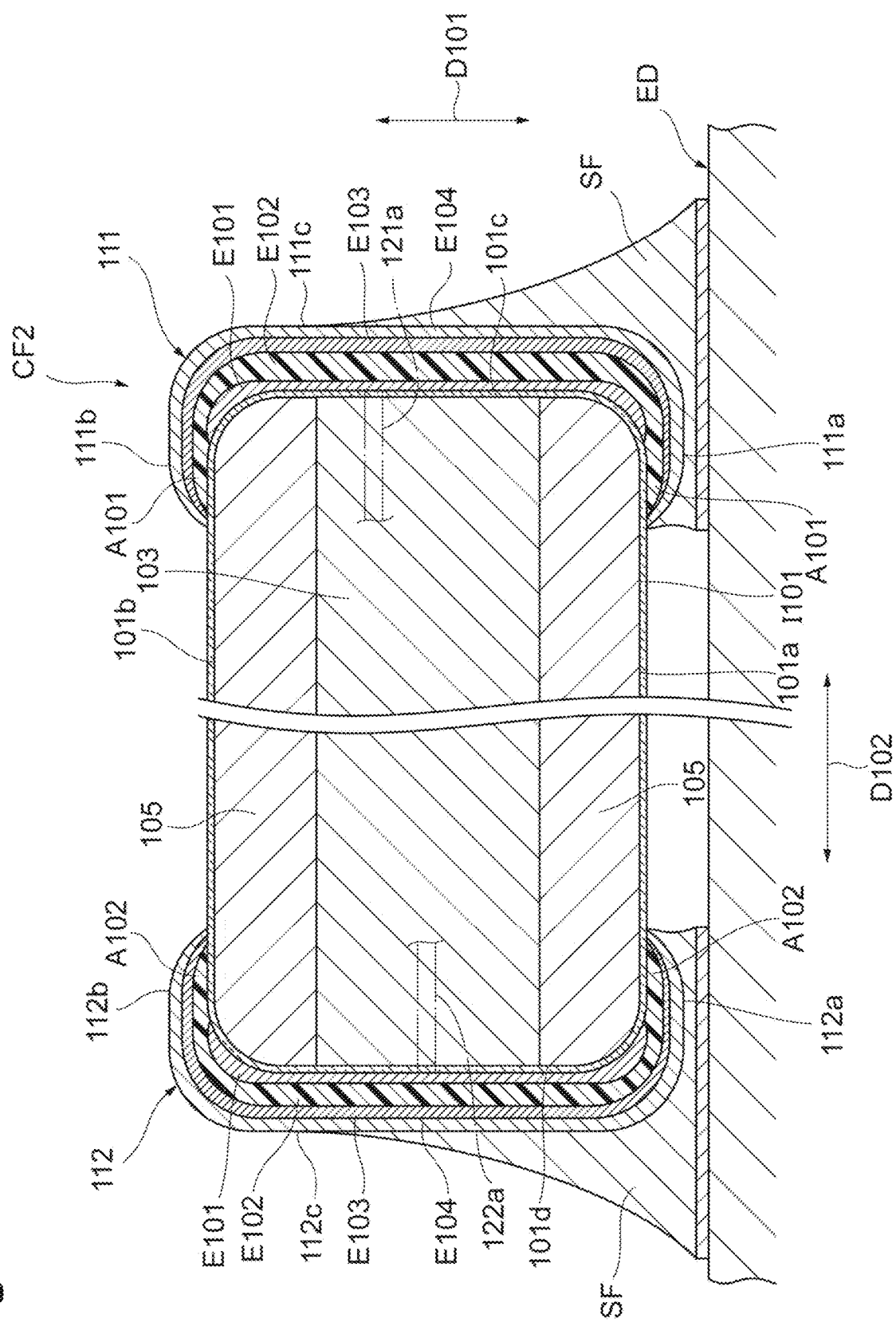
FIG. 20 is a diagram illustrating a mounting structure of the multilayer common mode filter according to the second embodiment.
Figure 21:
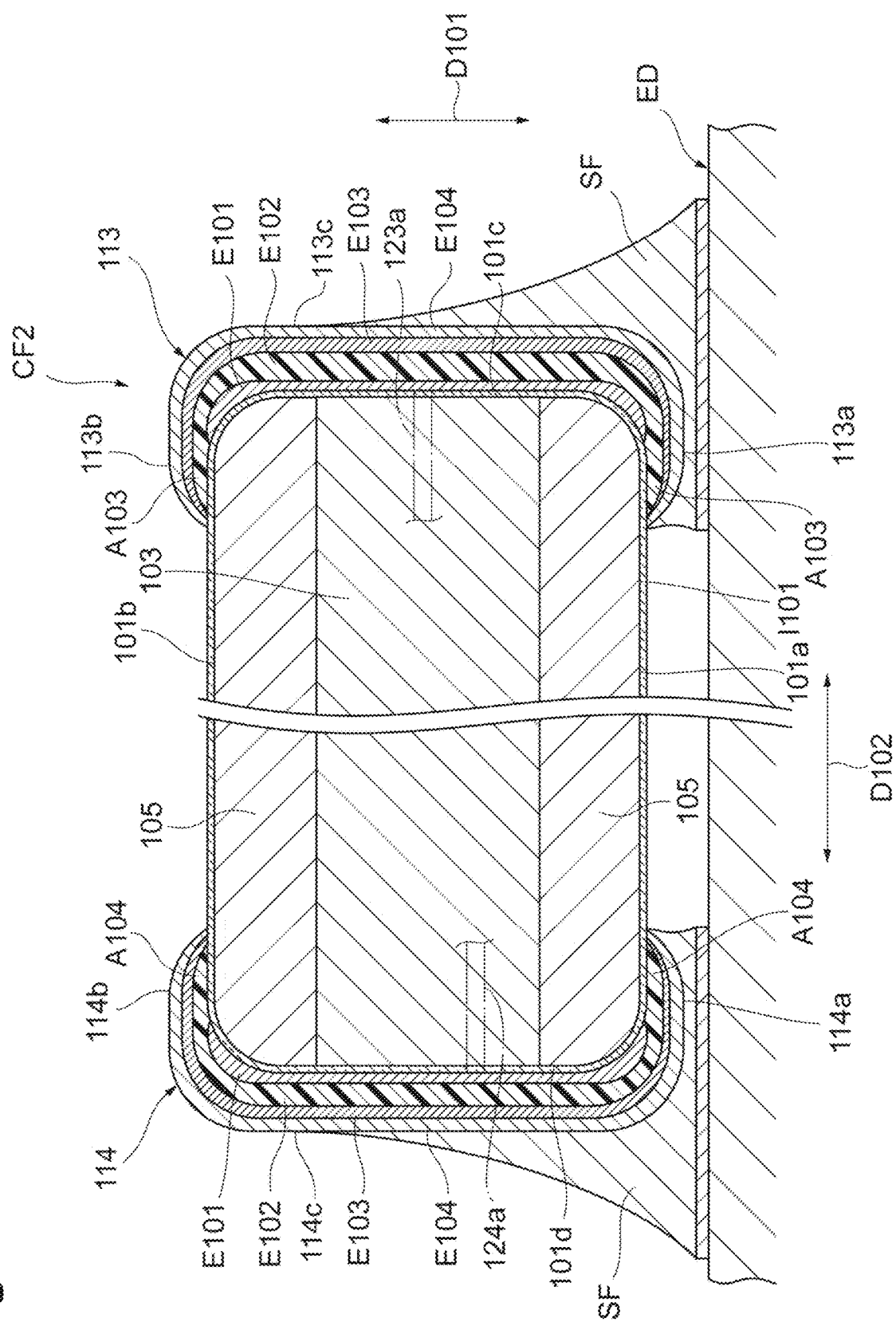
FIG. 21 is a diagram illustrating a mounting structure of the multilayer common mode filter according to the second embodiment.

As illustrated in FIGS. 20 and 21, the multilayer common mode filter CF2 is mounted to an electronic device ED by soldering. The electronic device ED is a circuit board or an electronic component, for example. A solder fillet SF is formed on the first terminal electrode 111, the second terminal electrode 112, the third terminal electrode 113, and the fourth terminal electrode 114 as the melted solder is solidified. FIGS. 20 and 21 are diagrams illustrating a mounting structure of the multilayer common mode filter according to the present embodiment. In the mounting structure illustrated in FIGS. 20 and 21, the first principal surface 101a is the mounting surface.

In the multilayer common mode filter CF2, the amorphous glass layer I101 is formed on the surfaces (first and second principal surfaces 101a and 101b) of the magnetic portions 105. The amorphous glass layer I101 is disposed between the edges A101, A102, A103, A104 of the second electrode layers E102, and the surfaces of the magnetic portions 105, at the first to fourth terminal electrodes 111, 112, 113, and 114. In the multilayer common mode filter CF2, even though the surface of the amorphous glass layer I101 is smoother than the surface of the magnetic portion 105, peeling of the second electrode layer E102 from the element body 101 (the amorphous glass layer I101) is suppressed, as compared with a multilayer common mode filter in which the second electrode layer E102 is directly disposed on the magnetic portion 105.

In the multilayer common mode filter CF2, the external electrode includes the plurality of terminal electrodes 111, 112, 113, and 114. Each of the terminal electrodes 111, 112, 113, and 114 includes the second electrode layer E102. When the plurality of terminal electrodes is disposed on the element body 101, the contact area between the second electrode layer E102 of each of the terminal electrodes and the element body 101 is small, as compared with when the number of terminal electrodes is one. When the contact area between the second electrode layer E102 and the element body 101 is small, the second electrode layer E102 may peel off from the element body 101. However, the amorphous glass layer I101 is disposed between the edges A101, A102, A103, and A104 of the second electrode layers E102, and the surfaces of the magnetic portions 105, and thus the second electrode layer E102 tends not to peel off from the element body 101 (amorphous glass layer I101).

As illustrated in FIGS. 20 and 21, when the multilayer common mode filter CF2 is mounted to the electronic device ED by soldering in the state where the first principal surface 101a opposes the electronic device ED, the external force acting on the multilayer common mode filter CF2 from the electronic device ED tends to act as a stress on the electrode portions 111a, 112a, 113a, and 114a. If the external force acts on the electrode portions 111a, 112a, 113a, and 114a, the second electrode layers E102 included in the electrode portions 111a, 112a, 113a, and 114a may peel off from the element body 101 (amorphous glass layer I101). However, in the multilayer common mode filter CF2, the amorphous glass layer I101 is disposed between the edges A101, A102, A103, and A104 of the second electrode layers E102, and the first principal surface 101a, and thus the second electrode layers E102 tend not to peel off from the element body 101 (amorphous glass layer I101) even when the multilayer common mode filter CF2 is mounted to the electronic device.

In the multilayer common mode filter CF2, each of the electrode portions 111a, 112a, 113a, and 114a includes the second electrode layer E102. Therefore, even if the external force acts on the multilayer common mode filter CF2, the external force is reduced by the second electrode layers E102. A stress tends not to occur in the element body 101. As a result, in the multilayer common mode filter CF2, occurrence of cracks in the element body 101 is suppressed.

Figure 22:
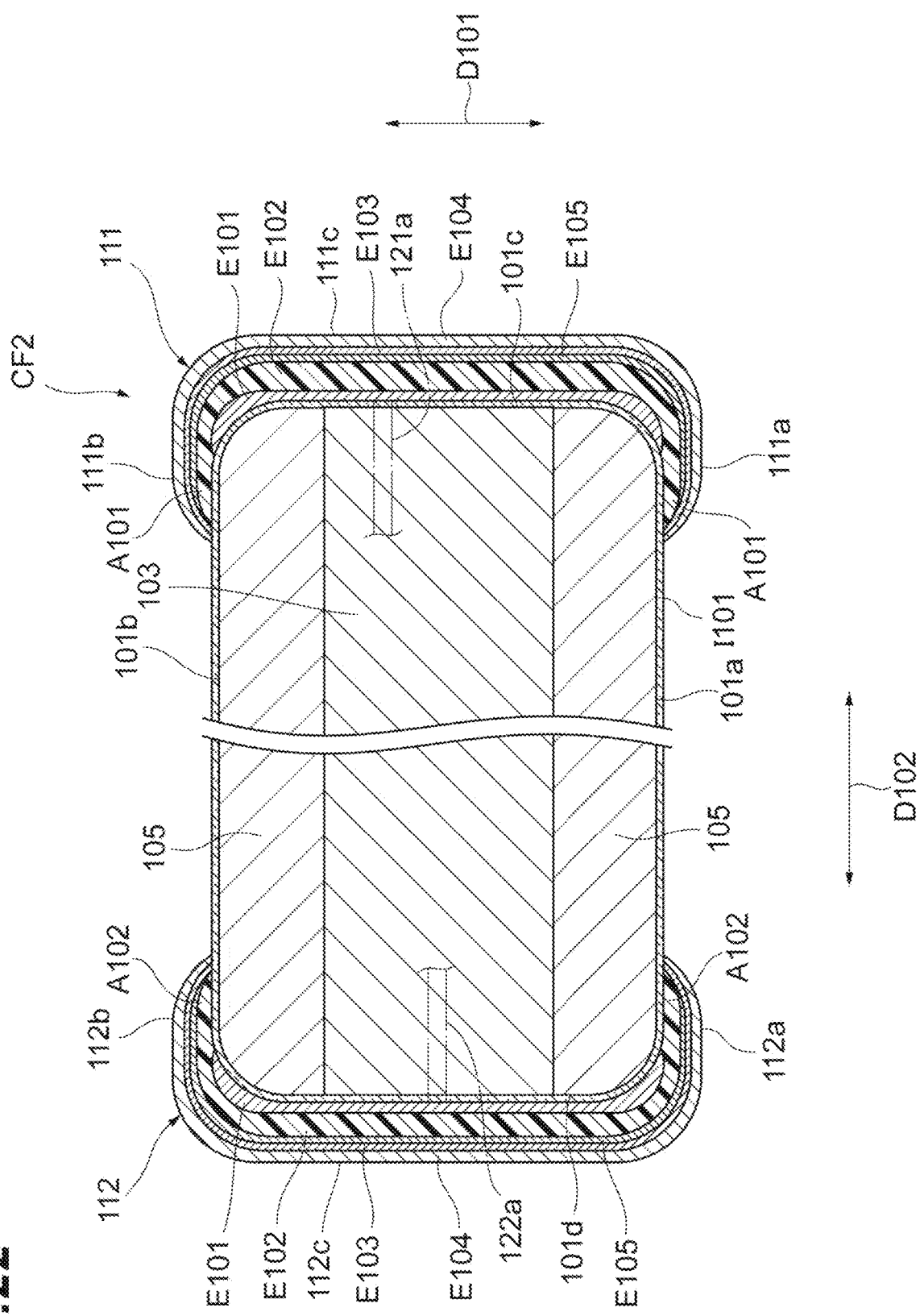
FIG. 22 is a diagram illustrating a cross-sectional configuration of a multilayer common mode filter according to a modification of the second embodiment.
Figure 23:
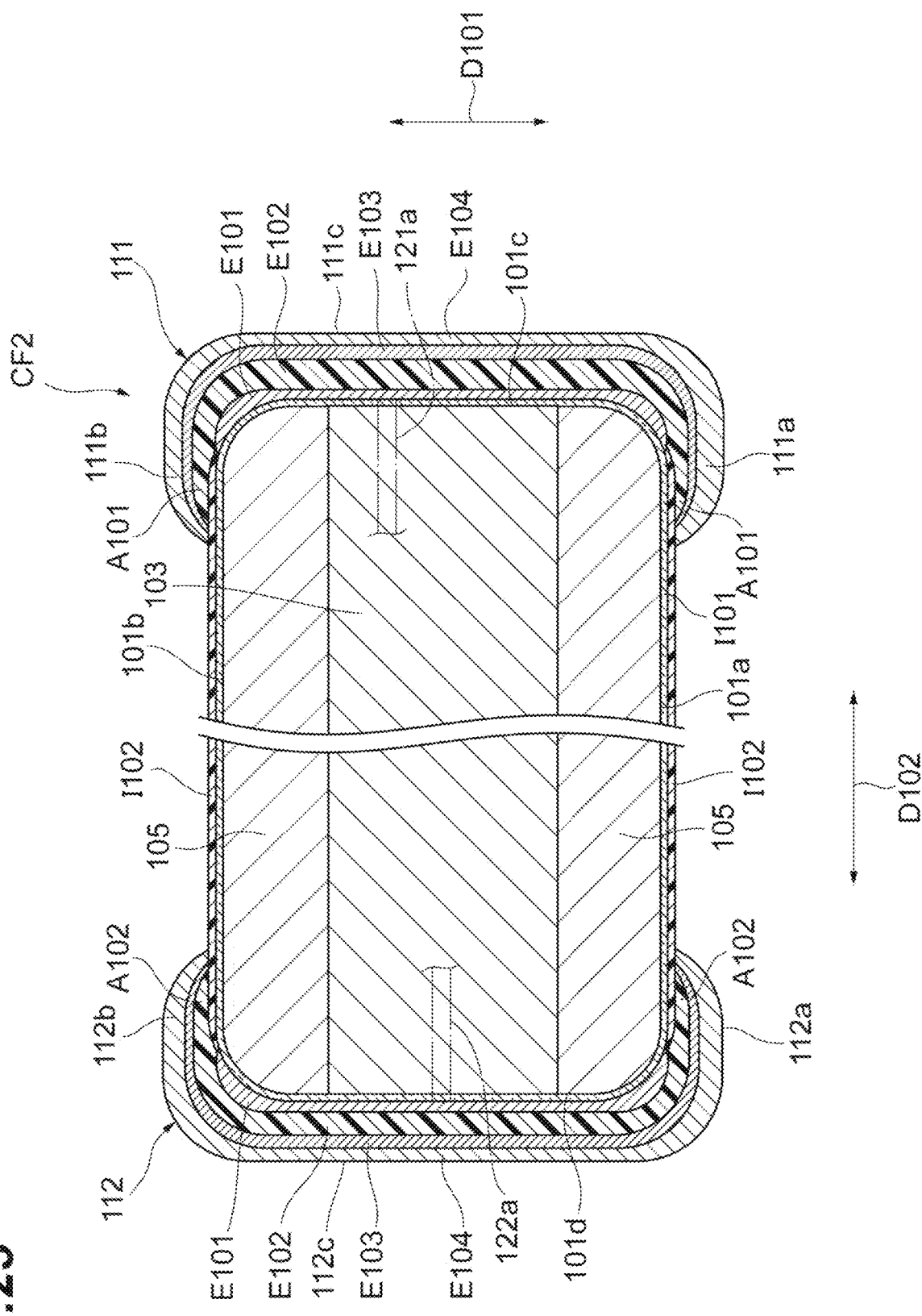
FIG. 23 is a diagram illustrating a cross-sectional configuration of a multilayer common mode filter according to a modification of the second embodiment.
Figure 24:
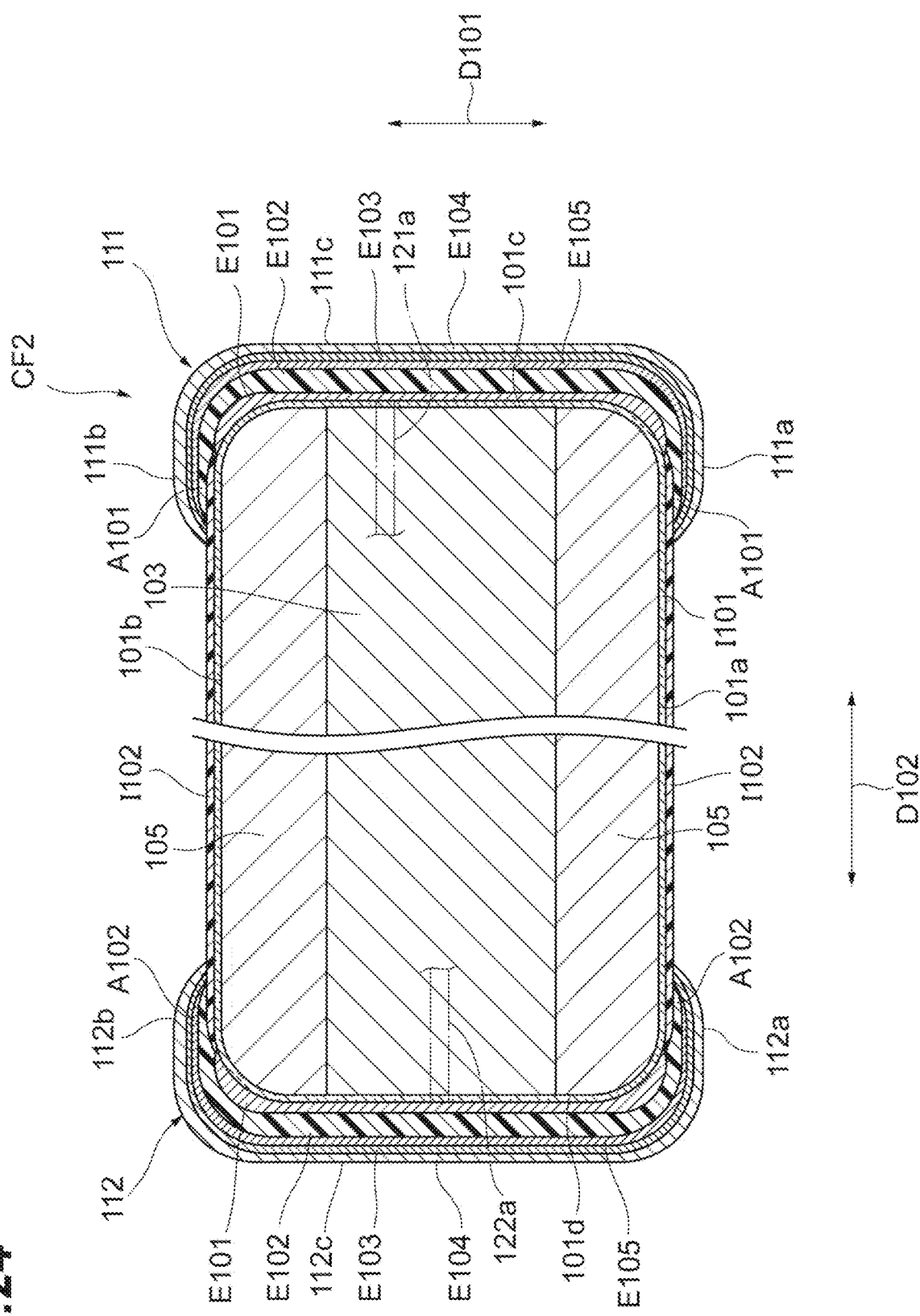
FIG. 24 is a diagram illustrating a cross-sectional configuration of a multilayer common mode filter according to a modification of the second embodiment.

Next, configurations of multilayer common mode filters CF2 according to modifications of the second embodiment will be described with reference to FIGS. 22 to 24. FIGS. 22 to 24 are diagrams illustrating cross-sectional configurations of the multilayer common mode filters according to the present modifications. The cross-sectional configuration including the third terminal electrode 113 and the fourth terminal electrode 114 is the same as the cross-sectional configuration including the first terminal electrode 111 and the second terminal electrode 112 illustrated in FIGS. 22 to 24, and thus illustration of the cross-sectional configuration including the third terminal electrode 113 and the fourth terminal electrode 114 is omitted.

The multilayer common mode filter CF2 illustrated in FIG. 22 and the multilayer common mode filter CF2 according to the second embodiment are different in the configuration of the plating layer of the first terminal electrode 111, the second terminal electrode 112, the third terminal electrode 113, and the fourth terminal electrode 114. In the multilayer common mode filter CF2 illustrated in FIG. 22, a fifth electrode layer E105 is disposed between the second electrode layer E102 and the third electrode layer E103.

The fifth electrode layer E105 is a plating layer and is formed on the second electrode layer E102 by a plating method. The fifth electrode layer E105 is integrally formed in each of the electrode portions 111a to 111c, 112a to 112c, 113a to 113c, and 114a to 114c. An edge of the fifth electrode layer E105 is included in each of the electrode portions 111a, 111b, 112a, 112b, 113a, 113b, 114a, and 114b. The fifth electrode layer E105 is a Cu plating layer formed by Cu plating, for example. The third electrode layer E103 is formed on the fifth electrode layer E105 by a plating method.

In the present modification, the plating layer formed on the second electrode layer E102 has a three-layer structure. In each of the electrode portions 111a to 111c, 112a to 112c, 113a to 113c, and 114a to 114c, the entire second electrode layer E102 is covered with the plating layer laminated in the order of the fifth electrode layer E105, the third electrode layer E103, and the fourth electrode layer E104.

The multilayer common mode filter CF2 illustrated in FIG. 23 is different from the multilayer common mode filter CF2 according to the second embodiment in including a resin layer I102. In the multilayer common mode filter CF2 illustrated in FIG. 23, the resin layer I102 is disposed on the first principal surface 101a in such a manner that the amorphous glass layer I101 is interposed between the resin layer I102 and the first principal surface 101a. The resin layer I102 is also disposed on the second principal surface 101b in such a manner that the amorphous glass layer I101 is interposed between the resin layer I102 and the second principal surface 101b. The resin layers I102 are in contact with the amorphous glass layer I101. The resin layers I102 have electrical insulation properties. In the present modification, the edges A101, A102, A103, and A104 of the second electrode layers E102 are in contact with the resin layer I102. The edges A101, A102, A103, and A104 of the second electrode layers E102 are disposed on the first and second principal surfaces 101a and 101b in such a manner that the resin layer I102 and the amorphous glass layer I101 are interposed between the second electrode layers E102 and the first and second principal surfaces 101a and 101b.

The multilayer common mode filter CF2 illustrated in FIG. 24 is different from the multilayer common mode filter CF2 illustrated in FIG. 22 in including the resin layer I102.

In the multilayer common mode filters CF2 illustrated in FIGS. 23 and 24, the resin layer I102 is disposed between the amorphous glass layer I101 and the edges A101, A102, A103, and A104 of the second electrode layers E102. The edges A101, A102, A103, and A104 of the second electrode layers E102 are in contact with the resin layer I102. The second electrode layer E102 includes a conductive material (for example, metal powder) and a resin (for example, a thermosetting resin). Therefore, the resin layer I102 not containing a conductive material has higher adhesive strength to the amorphous glass layer I101 than the second electrode layer E102. Since the edges A101, A102, A103, and A104 of the second electrode layers E102 are in contact with the resin layer I102, peeling of the second electrode layers E102 from the element body 101 (resin layer I102) is further suppressed.

The second embodiment and the modifications described above may include the following configurations.

The first terminal electrode 111, the second terminal electrode 112, the third terminal electrode 113, and the fourth terminal electrode 114 do not necessarily include the electrode portions 111b, 112b, 113b, and 114b. The first terminal electrode 111 and the third terminal electrode 113 may be disposed only on the two surfaces 101a and 101c, and the second terminal electrode 112 and the fourth terminal electrode 114 may be disposed only on the two surfaces 101a and 101d.

The plating layer disposed on the second electrode layer E102 does not necessarily have a two-layer structure or a three-layer structure. The plating layer disposed on the second electrode layer E102 may be one layer or may have a multilayer structure of four or more layers.

The number of the terminal electrodes disposed on each of the end portions of the element body 101 in the second direction D102 is not limited to "two." The number of the terminal electrodes disposed on each of the end portions of the element body 101 in the second direction D102 may be "three or more".

Although the embodiments and modifications of the present invention have been described above, the present invention is not necessarily limited to the embodiments and modifications, and the embodiment can be variously changed without departing from the scope of the invention.

In the multilayer common mode filters CF1 and CF2, a plurality of coil conductors configures one coil. However, one coil conductor may configure one coil. When one coil conductor configures one coil, both ends of the one coil conductor are connected to corresponding terminal electrodes. In the multilayer common mode filters CF1 and CF2, two coils are provided in the element body. However, the number of coils may be "three or more".

In the first and second embodiments and the modifications, the electronic components are the multilayer common mode filters CF1 and CF2. However, the electronic components to which the present invention can be applied are not limited to the multilayer common mode filters. An electronic component to which the present invention can be applied is, for example, a multilayer electronic component such as a multilayer capacitor, a multilayer inductor, a multilayer varistor, a multilayer piezoelectric actuator, a multilayer thermistor, a multilayer composite component, or an electronic component other than the multilayer electronic components.

What is claimed is:

1. An electronic component comprising:
   an element body including a magnetic portion made of a ferrite material;
   an amorphous glass layer formed on a surface of the magnetic portion; and
   an external electrode including a conductive resin layer disposed on the element body and a sintered metal layer made of Ag disposed on the conductive resin layer and in contact with the conductive resin layer,
   wherein the amorphous glass layer is disposed between an edge of the conductive resin layer and the surface of the magnetic portion, and
   the element body is a sintered body configured by a plurality of laminated insulating layers.

2. The electronic component according to claim 1, wherein
   the element body includes a principal surface including at least a part of the surface of the magnetic portion, and a side surface adjacent to the principal surface,
   the external electrode includes a first electrode portion disposed on the principal surface and a second electrode portion disposed on the side surface,
   the amorphous glass layer is formed on the principal surface,
   the conductive resin layer is included in the first electrode portion and the second electrode portion,
   the edge of the conductive resin layer is included in the first electrode portion, and
   the amorphous glass layer is disposed between the edge of the conductive resin layer and the principal surface.

3. The electronic component according to claim 1, further comprising:
   an insulating resin layer disposed between the amorphous glass layer and the edge of the conductive resin layer,
   wherein the edge of the conductive resin layer is in contact with the insulating resin layer.

4. The electronic component according to claim 1, wherein the external electrode includes a plurality of terminal electrodes, each of the terminal electrodes including the conductive resin layer.

5. The electronic component according to claim 1, wherein a surface roughness of the amorphous glass layer is smaller than a surface roughness of the magnetic portion.

6. The electronic component according to claim 1, wherein the element body is configured by a ferrite sintered body.

7. The electronic component according to claim 1, further comprising an internal conductor disposed in the element body and made of a sintered metal body.

* * * * *